United States Patent
Kim et al.

(10) Patent No.: US 12,302,679 B2
(45) Date of Patent: May 13, 2025

(54) LIGHT EMITTING DIODE

(71) Applicant: SEOUL VIOSYS CO., LTD., Ansan-si (KR)

(72) Inventors: Jae Kwon Kim, Ansan-si (KR); Min Chan Heo, Ansan-si (KR); Kyoung Wan Kim, Ansan-si (KR); Jong Kyu Kim, Ansan-si (KR); Hyun A Kim, Ansan-si (KR); Joon Sup Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/671,619

(22) Filed: May 22, 2024

(65) Prior Publication Data

US 2024/0313184 A1    Sep. 19, 2024

Related U.S. Application Data

(63) Continuation of application No. 17/389,025, filed on Jul. 29, 2021, now Pat. No. 12,015,112, which is a
(Continued)

(30) Foreign Application Priority Data

Jan. 31, 2019   (KR) .................. 10-2019-0012666
Jan. 31, 2019   (KR) .................. 10-2019-0012988

(51) Int. Cl.
*H10H 20/857*   (2025.01)
*H10H 20/814*   (2025.01)
(Continued)

(52) U.S. Cl.
CPC ........ *H10H 20/857* (2025.01); *H10H 20/814* (2025.01); *H10H 20/841* (2025.01); *H10H 29/142* (2025.01)

(58) Field of Classification Search
CPC ....... H01L 33/62; H01L 27/156; H01L 33/10; H01L 33/46; H01L 33/405; H10H 20/857;
(Continued)

(56) References Cited

U.S. PATENT DOCUMENTS 9,466,765 B1   10/2016   Yoon et al.
10,804,437 B2  10/2020   Kim et al.
(Continued)

FOREIGN PATENT DOCUMENTS

CN   107799638 A   3/2018
EP   3353821 A1   8/2018
(Continued)

OTHER PUBLICATIONS

Office Action from corresponding Chinese Application No. 201911369944.5 dated May 6, 2024.
(Continued)

*Primary Examiner* — Thanh T Nguyen
(74) *Attorney, Agent, or Firm* — Perkins Coie LLP

(57) ABSTRACT

A light emitting diode includes a first conductivity type semiconductor layer, a mesa disposed on the first conductivity type semiconductor layer, and including an active layer and a second conductivity type semiconductor layer, and a lower insulation layer covering the mesa and at least a portion of the first conductivity type semiconductor layer exposed around the mesa, and having a first opening for allowing electrical connection to the first conductivity type semiconductor layer and a second opening for allowing electrical connection to the second conductivity type semiconductor layer. The active layer generates light having a peak wavelength of about 500 nm or less, and the lower insulation layer includes a distributed Bragg reflector.

20 Claims, 23 Drawing Sheets

Related U.S. Application Data continuation of application No. PCT/KR2019/017219, filed on Dec. 6, 2019.

(51) Int. Cl.
  *H10H 20/841* (2025.01)
  *H10H 29/14* (2025.01)

(58) Field of Classification Search
  CPC .. H10H 20/814; H10H 20/841; H10H 29/142; H10H 20/835; H10H 20/832
  See application file for complete search history.

(56) References Cited

U.S. PATENT DOCUMENTS

| | | |
|---|---|---|
| 2013/0056776 A1 | 3/2013 | Su et al. |
| 2015/0357525 A1 | 12/2015 | Sasaki |
| 2016/0133615 A1 | 5/2016 | Park |
| 2016/0149086 A1 | 5/2016 | Sim et al. |
| 2018/0135809 A1 | 5/2018 | Kim et al. |
| 2018/0261727 A1 | 9/2018 | Huang et al. |
| 2018/0323236 A1 | 11/2018 | Oh et al. |
| 2019/0067526 A1* | 2/2019 | Kim .................. H01L 33/46 |
| 2021/0359188 A1 | 11/2021 | Kim et al. |

FOREIGN PATENT DOCUMENTS

| | | |
|---|---|---|
| EP | 3353821 B1 | 5/2021 |
| KR | 1020110085961 A | 7/2011 |
| KR | 101354720 B1 | 2/2014 |
| KR | 1020160141035 A | 12/2016 |
| KR | 20180050929 A | 5/2018 |
| KR | 20180062347 A | 6/2018 |
| KR | 1020180062347 A | 6/2018 |
| WO | 2017069372 A1 | 4/2017 |

OTHER PUBLICATIONS

Extended European Search Report dated Oct. 4, 2022, issued to European Patent Application No. 19913227.5.

International Search Report for International Application No. PCT/KR2019/017219, mailed Apr. 16, 2020, 7 pages.

Office Action of related corresponding Chinese Application 201911399673, dated Jun. 1, 2024.

Office Action of related corresponding Chinese Application 201911399687, dated May 31, 2024.

Office Action of related corresponding Chinese Application 201911369944, dated Jul. 16, 2024.

* cited by examiner

LIGHT EMITTING DIODE

CROSS-REFERENCE TO RELATED APPLICATIONS

This application is a continuation of U.S. patent application Ser. No. 17/389,025, filed on Jul. 29, 2021, which is a continuation of International Application No. PCT/KR2019/017219, filed on Dec. 6, 2019, which claims priority to and the benefit of Korean Patent Application No. 10-2019-0012666, filed on Jan. 31, 2019, and Korean Patent Application No. 10-2019-0012988, filed on Jan. 31, 2019. The aforementioned applications of which are incorporated herein by reference in their entireties.

TECHNICAL FIELD

Exemplary embodiments relate to a light emitting diode.

BACKGROUND

In general, with favorable thermal stability and a direct transition type energy band structure, Group III-based nitrides, such as gallium nitride (GaN), aluminum nitride (AlN), and the like, have been spotlighted as materials for light sources in visible and ultraviolet ranges. In particular, blue and green light emitting diodes using indium gallium nitride are used in various fields including large full color flat panel displays, signal lamps, interior lighting, high density light sources, high resolution output systems, optical communication, and the like.

Meanwhile, a distributed Bragg reflector is a reflector having a high reflectance in a specific wavelength band by stacking insulation layers having different indices of refraction from one another. The distributed Bragg reflector reduces light loss by reflecting light in the light emitting diode, thereby improving light efficiency of the light emitting diode.

The distributed Bragg reflector formed on a flat surface such as a substrate can form a uniform layer, and thus, the reflector is highly reliable. Meanwhile, when the distributed Bragg reflector is formed on a structure having a side surface such as a mesa, a large number of fine cracks or pinholes may be formed in the distributed Bragg reflector, and thus, reliability may deteriorate due to moisture permeation.

In particular, the distributed Bragg reflector requires a large number of stacks since reflectance thereof increases as the number of stacked layers increases. In addition, a thickness of the distributed Bragg reflector is further increased so as to have a high reflectance in a wide wavelength band of the visible region. The increased thickness of the distributed Bragg reflector further reduces reliability of the light emitting diode and makes a manufacturing process of the light emitting diode difficult.

Meanwhile, the light emitting diode is provided in various chip types, and light emitting diode chips are mounted on a mounting surface of a package, a sub-mount, a printed circuit board, or the like. For example, a flip-chip type light emitting diode includes bump pads, and the bump pads are mounted on connection pads of a printed circuit board or the like through a solder paste.

A mounting process according to prior art is generally carried out through a reflow process after applying the solder paste on the connection pads, and putting the bump pads of the light emitting diode chip on the solder paste, and accordingly, the bump pads are bonded to the connection pads by the solder.

However, in order to bond the light emitting diode chips, a significant amount of solder paste on the connection pads may be applied. For this purpose, the solder paste may be applied several times on one connection pad. As the amount of the solder paste applied on the connection pads increases, the mounting process of the light emitting diode chips may become more complicated.

As the bump pads formed on the light emitting diode chips generally have a relatively small thickness, it is not helpful to handle the light emitting diode chips. Accordingly, it is difficult to form a white wall for improving luminous intensity of the light emitting diode chip. For the light emitting diode chip having a relatively small size, the mounting process using the solder paste may be complex.

SUMMARY

Exemplary embodiments provide a light emitting diode employing a distributed Bragg reflector capable of reducing a thickness thereof while maintaining a relatively high reflectance.

Exemplary embodiments provide a light emitting diode having high reliability under a high humidity environment.

Exemplary embodiments provide a light emitting diode chip with which a bonding process can be easily carried out using solder.

Exemplary embodiments provide a light emitting diode chip that is easy to handle.

A light emitting diode according to an exemplary embodiment includes a first conductivity type semiconductor layer, a mesa disposed on the first conductivity type semiconductor layer, and including an active layer and a second conductivity type semiconductor layer, and a lower insulation layer covering the mesa and at least a portion of the first conductivity type semiconductor layer exposed around the mesa, and having a first opening for allowing electrical connection to the first conductivity type semiconductor layer and a second opening for allowing electrical connection to the second conductivity type semiconductor layer, in which the active layer generates light having a peak wavelength of about 500 nm or less, the lower insulation layer includes a distributed Bragg reflector, the lower insulation layer has a high reflection wavelength band continuously exhibiting reflectances of 90% or more in a wavelength range of the visible region, reflectances in a first wavelength region including a peak wavelength of light generated in the active layer within the high reflection wavelength band are higher than those in a second wavelength region within a range of 554 nm to 700 nm, and the first wavelength region is located in a region of wavelengths shorter than 554 nm.

A light emitting diode according to another exemplary embodiment includes a first conductivity type semiconductor layer, a mesa disposed on the first conductivity type semiconductor layer, and including an active layer and a second conductivity type semiconductor layer, and a lower insulation layer covering the mesa and at least a portion of the first conductivity type semiconductor layer exposed around the mesa, and having a first opening for allowing electrical connection to the first conductivity type semiconductor layer and a second opening for allowing electrical connection to the second conductivity type semiconductor layer, in which the lower insulation layer includes a distributed Bragg reflector and a capping layer disposed on the distributed Bragg reflector, and the capping layer includes a mixed layer of at least two kinds of oxides including $SiO_2$.

A light emitting diode according to another exemplary embodiment includes a first conductivity type semiconductor layer, a mesa disposed on the first conductivity type semiconductor layer, and including an active layer and a second conductivity type semiconductor layer, a distributed Bragg reflector covering a side surface of the mesa and at least a portion of the first conductivity type semiconductor layer exposed around the mesa; and a protection layer covering the distributed Bragg reflector on the first conductivity type semiconductor layer, in which the protection layer includes a mixed layer of at least two kinds of oxides including $SiO_2$.

A light emitting diode according to another exemplary embodiment includes a first conductivity type semiconductor layer an active layer disposed on the first conductivity type semiconductor layer; a second conductivity type semiconductor layer disposed on the active layer, a first bump pad electrically connected to the first conductivity type semiconductor layer, a second bump pad electrically connected to the second conductivity type semiconductor layer, a first solder bump disposed on the first bump pad; and a second solder bump disposed on the second bump pad, in which the first and second solder bumps have thicknesses within a range of 10 times to 80 times of thicknesses of the first and second bump pads, respectively.

A light emitting diode according to another exemplary embodiment includes a substrate, a first conductivity type semiconductor layer disposed on the substrate, an active layer disposed on the first conductivity type semiconductor layer, a second conductivity type semiconductor layer disposed on the active layer, an upper insulation layer disposed on the second conductivity type semiconductor layer, and having openings for allowing electrical connection; and first and second solder bumps disposed on the upper insulation layer, and electrically connected to the first and second conductivity type semiconductor layers through the openings of the upper insulation layer, respectively, in which each of the first and second solder bumps has a thickness within a range of about 10 μm to about 100 μm.

A light emitting device according to another exemplary embodiment includes a mounting surface having connection pads, and a light emitting diode mounted on the mounting surface through solders, in which the light emitting diode includes a first conductivity type semiconductor layer, an active layer disposed on the first conductivity type semiconductor layer, a second conductivity type semiconductor layer disposed on the active layer, a first bump pad electrically connected to the first conductivity type semiconductor layer, and a second bump pad electrically connected to the second conductivity type semiconductor layer, in which the solders bond the connection pads and the first and second bump pads, and the solders have thicknesses within a range of 10 times to 80 times of thicknesses of the first and second bump pads.

A light emitting diode according to another exemplary embodiment includes a substrate, at least four light emitting cells disposed on the substrate, each of the light emitting cells including a first conductivity type semiconductor layer, an active layer, and a second conductivity type semiconductor layer, and at least two solder bumps disposed on the light emitting cells, in which the at least four light emitting cells include at least two light emitting cells disposed near one edge of the substrate and at least two light emitting cells disposed near the opposite edge of the substrate, a solder bump(s) is provided on two or more light emitting cells among the at least two light emitting cells disposed near one edge of the substrate, and a solder bump(s) is provided on two or more light emitting cells among the at least two light emitting cells disposed near the opposite edge of the substrate.

According to exemplary embodiments of the present disclosure, a thickness of a distributed Bragg reflector may be reduced by having a high reflectance for light generated in an active layer, and by having a relatively low reflectance for visible light in a region of relatively longer wavelengths, and thus, it is possible to provide a light emitting diode with high reliability.

In addition, a light emitting diode with high reliability may be provided under a high temperature and high humidity environment by protecting a distributed Bragg reflector using a waterproof capping layer capable of preventing moisture permeation.

Furthermore, a bonding process may be easily carried out by providing a relatively thick solder bump on a light emitting diode, and handling of a light emitting diode chip may be facilitated.

Other advantages and effects of the present disclosure will become more apparent through detailed descriptions.

DESCRIPTION OF DRAWINGS

FIG. 19A illustrates forming bump pads on a substrate;

FIG. 19B illustrates disposing a mask on the substrate;

FIG. 19C illustrates removing a mask and reflowing a solder paste through a reflow process;

FIG. 19D illustrates forming first and second solder bumps;

FIG. 19E illustrates completing fabrication of individual light emitting diodes; and FIG. 19F illustrates bonding a light emitting diode on a sub-mount substrate having connection pads.

DETAILED DESCRIPTION OF EMBODIMENTS

Figure 1:
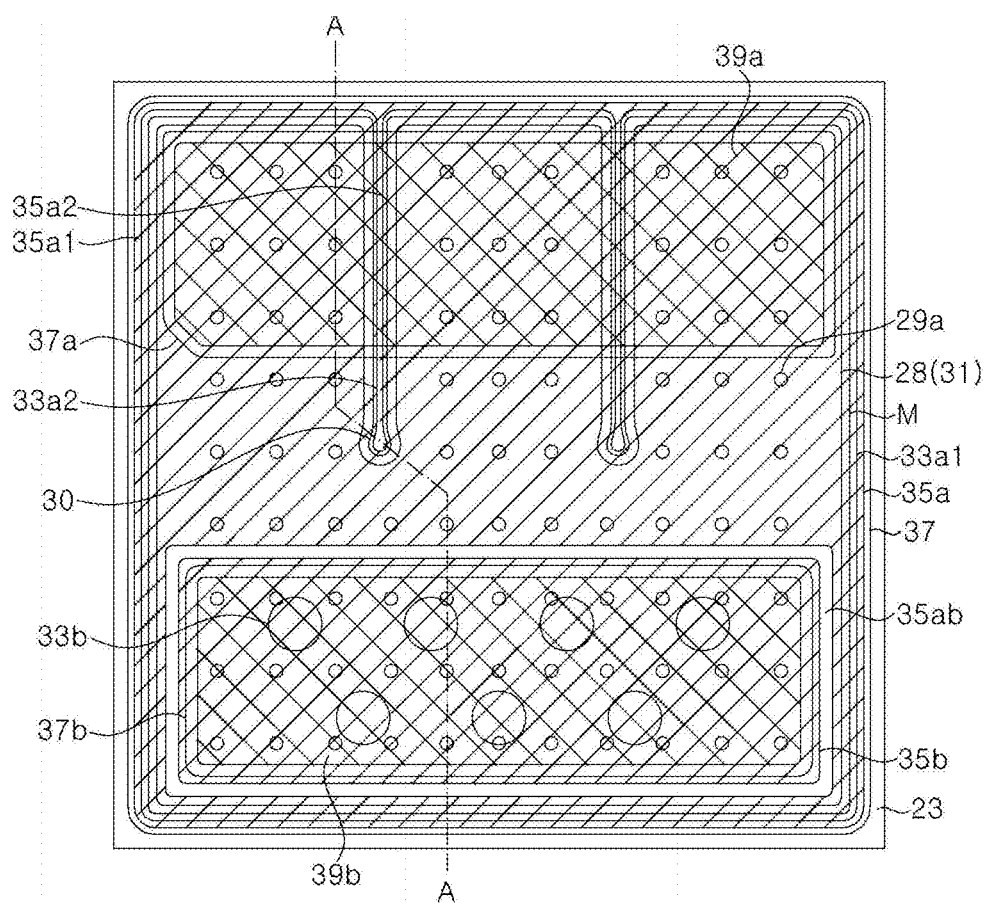
FIG. 1 is a schematic plan view illustrating a light emitting diode according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

A light emitting diode according to an exemplary embodiment includes: a first conductivity type semiconductor layer; a mesa disposed on the first conductivity type semiconductor layer, and including an active layer and a second conductivity type semiconductor layer; and a lower insulation layer covering the mesa and at least a portion of the first conductivity type semiconductor layer exposed around the mesa, and having a first opening for allowing electrical connection to the first conductivity type semiconductor layer and a second opening for allowing electrical connection to the second conductivity type semiconductor layer, in which the active layer generates light having a peak wavelength of about 500 nm or less, the lower insulation layer includes a distributed Bragg reflector, the lower insulation layer has a high reflection wavelength band continuously exhibiting reflectance of 90% or more in a wavelength range of the visible region, reflectances in a first wavelength region including a peak wavelength of light generated in the active layer within the high reflection wavelength band are higher than those in a second wavelength region within a range of 554 nm to 700 nm, and the first wavelength region is located in a region of wavelengths shorter than 554 nm.

Since the first wavelength region having relatively high reflectance within the high reflection wavelength band is provided, an overall thickness of the distributed Bragg reflector may be reduced, and thus, a light emitting diode capable of improving reliability may be provided.

The lower insulation layer may further include a capping layer disposed on the distributed Bragg reflector.

The lower insulation layer has a high reflection wavelength band continuously exhibiting reflectance of a predetermined threshold or more in a wavelength range of a visible region. The high reflection wavelength band comprises a first wavelength region and a second wavelength region, the first wavelength region including a peak wavelength of light generated in the active layer. First reflectance in the first wavelength region is higher than second reflectance of the second wavelength region.

An upper insulation layer covering the first pad metal layer and the second pad metal layer and including a third opening of the upper insulation layer exposing the first pad metal layer and a fourth opening of the upper insulation layer exposing the second pad metal layer.

The plurality of light emitting cells further comprises a first light emitting cell and a second light emitting cell, a first pad metal layer disposed on the first light emitting cell, a second pad metal layer disposed on the second light emitting cell, a connection metal layer electrically connecting adjacent light emitting cells, and an upper insulation layer covering the first pad metal layer and the second pad metal layer and including a third opening of the upper insulation layer exposing the first pad metal layer and a fourth opening of the upper insulation layer exposing the second pad metal layer. The first pad metal layer is connected to the first conductivity type semiconductor layer through the third opening, and the second pad metal layer is electrically connected to the second conductivity type semiconductor layer through the fourth opening.

In some exemplary embodiments, the capping layer may include a mixed layer of at least two kinds of oxides including $SiO_2$. Herein, the term "mixed layer" refers to a layer in which two or more kinds of oxides are mixed with one another. For example, an oxide such as $TiO_2$, SnO2, MgO, ZnO, or the like may be mixed in a $SiO_2$ layer. In an exemplary embodiment, the capping layer may include a $SiO_2$—$TiO_2$ mixed layer. The $SiO_2$—$TiO_2$ mixed layer refers to a layer in which $SiO_2$ and $TiO_2$ are mixed, and in consideration of DBR design, about 1 mol % to 5 mol % of $TiO_2$ may be randomly mixed in the $SiO_2$—$TiO_2$ mixed layer. The $SiO_2$—$TiO_2$ capping layer has a waterproof characteristic, and thus, reliability of the light emitting diode may be improved under a high temperature and high humidity environment.

In an exemplary embodiment, the capping layer may cover an upper surface of the distributed Bragg reflector and expose a side surface thereof. In another exemplary embodiment, the capping layer may cover the upper and side surfaces of the distributed Bragg reflector.

Meanwhile, the lower insulation layer may have a reflectance of 98% or more in a wavelength range of 420 nm to 480 nm, and may have a reflectance of 90% or more in a wavelength range of 554 nm to 700 nm.

In an exemplary embodiment, the first wavelength region may be within the range of 420 nm to 480 nm, and reflectances in the first wavelength region may be higher than those in wavelengths in a range of 500 nm to 700 nm.

The light emitting diode may further include: a transparent conductive oxide layer disposed on the mesa and electrically connected to the second conductivity type semiconductor layer; a dielectric layer covering the conductive oxide layer, and having a plurality of openings exposing the conductive oxide layer; and a metal reflection layer disposed on the dielectric layer, and connected to the conductive oxide layer through the openings of the dielectric layer, in which the lower insulation layer may be disposed on the metal reflection layer, the first opening may expose the first conductivity type semiconductor layer, and the second opening may expose the metal reflection layer.

Moreover, the light emitting diode may further include: a first pad metal layer disposed on the lower insulation layer, and electrically connected to the first conductivity type semiconductor layer through the first opening of the lower insulation layer; and a second pad metal layer disposed on the lower insulation layer, and electrically connected to the second conductivity type semiconductor layer through the second opening of the lower insulation layer.

In addition, the light emitting diode may further include an upper insulation layer covering the first pad metal layer and the second pad metal layer, and including a first opening exposing the first pad metal layer and a second opening exposing the second pad metal layer.

In some exemplary embodiments, the upper insulation layer may include a $SiO_2$—$TiO_2$ mixed layer.

In addition, the upper insulation layer may cover a side surface of the lower insulation layer.

The light emitting diode may further include: a first bump pad; and a second bump pad, in which the first bump pad and the second bump pad may be electrically connected to the first pad metal layer and the second pad metal layer through the first opening and the second opening of the upper insulation layer, respectively In some exemplary embodiments, the light emitting diode may further include: a substrate; and a plurality of light emitting cells disposed on the substrate, in which each of the light emitting cells may include the first conductivity type semiconductor layer and the mesa, in which the lower insulation layer may cover the plurality of light emitting cells, and may have first openings and second openings for allowing electrical connection to the first conductivity type semiconductor layer and the second conductivity type semiconductor layer of each of the light emitting cells.

In addition, the lower insulation layer may cover the substrate exposed between the light emitting cells.

In addition, the light emitting diode may further include: a transparent conductive oxide layer disposed on the mesa of each of the light emitting cells and electrically connected to the second conductivity type semiconductor layer; a dielectric layer covering the conductive oxide layer on each of the light emitting cells, and having a plurality of openings exposing the conductive oxide layer; and a metal reflection layer disposed on the dielectric layer on each of the light emitting cells, and connected to the conductive oxide layer through the openings of the dielectric layer, in which the lower insulation layer may be disposed on the metal reflection layers, the first openings may expose the first conductivity type semiconductor layers, and the second openings may expose the metal reflection layers.

The dielectric layers may be spaced apart from one another, and each of the dielectric layers may be located in an upper region of the first conductivity type semiconductor layer of each of the light emitting cells.

Moreover, the light emitting diode may further include: a first pad metal layer disposed on any one of the light emitting cells and connected to the first conductivity type semiconductor layer through the first opening; a second pad metal layer disposed on another one of the light emitting cells and electrically connected to the second conductivity type semiconductor layer through the second opening; and a connection metal layer electrically connecting adjacent light emitting cells.

A light emitting diode according to another exemplary embodiment includes: a first conductivity type semiconductor layer; a mesa disposed on the first conductivity type semiconductor layer, and including an active layer and a second conductivity type semiconductor layer; and a lower insulation layer covering the mesa and at least a portion of the first conductivity type semiconductor layer exposed around the mesa, and having a first opening for allowing electrical connection to the first conductivity type semiconductor layer and a second opening for allowing electrical connection to the second conductivity type semiconductor layer, in which the lower insulation layer includes a distributed Bragg reflector and a capping layer disposed on the distributed Bragg reflector, and the capping layer includes a mixed layer of at least two kinds of oxides including $SiO_2$.

In an exemplary embodiment, the mixed layer may be a $SiO_2$—$TiO_2$ mixed layer.

A light emitting diode according to another exemplary embodiment includes: a first conductivity type semiconductor layer; a mesa disposed on the first conductivity type semiconductor layer, and including an active layer and a second conductivity type semiconductor layer; a distributed Bragg reflector covering a side surface of the mesa and at least a portion of the first conductivity type semiconductor layer exposed around the mesa; and a protection layer covering the distributed Bragg reflector on the first conductivity type semiconductor layer, in which the protection layer includes a mixed layer of at least two kinds of oxides including $SiO_2$.

In an exemplary embodiment, the mixed layer may be a $SiO_2$—$TiO_2$ mixed layer.

The protection layer may cover an entire upper surface of the distributed Bragg reflector. For example, the protection layer may be a capping layer.

In some exemplary embodiments, the protection layer may cover a portion of the upper surface and a side surface of the distributed Bragg reflector. For example, the protection layer may be an upper insulation layer.

A light emitting diode according to another exemplary embodiment may include: a first conductivity type semiconductor layer; an active layer disposed on the first conductivity type semiconductor layer; a second conductivity type semiconductor layer disposed on the active layer; a first bump pad electrically connected to the first conductivity type semiconductor layer; a second bump pad electrically connected to the second conductivity type semiconductor layer; a first solder bump disposed on the first bump pad; and a second solder bump disposed on the second bump pad, in which the first and second solder bumps may have thicknesses within a range of 10 times to 80 times of thicknesses of the first and second bump pads, respectively.

Further, the first solder bump and the second solder bump may have an inclined side surface, and an inclination angle of the inclined side surface may be in a range of 65 degrees to 75 degrees with respect to a bottom surface thereof.

Meanwhile, an interval between the first solder bump and the second solder bump may be 2 times or more and 10 times or less of the thickness of the first solder bump or the second solder bump.

Moreover, the light emitting diode may further include a substrate disposed under the first conductivity type semiconductor layer, and the shortest distance in a lateral direction between the first solder bump or the second solder bump and the substrate may be equal to or greater than the thicknesses of the first solder bump and the second solder bump.

The light emitting diode may further include an upper insulation layer disposed on the second conductivity type semiconductor layer, in which the upper insulation layer may have openings for allowing electrical connection, in which the first and second bump pads may be disposed on the upper insulation layer, and electrically connected to the first and second conductivity type semiconductor layers through the openings.

In an exemplary embodiment, the first and second solder bumps may cover an entire upper surface of the first and second bump pads, respectively.

An interval between the first bump pad and the second bump pad may be 2 times or more and 10 times or less of the thickness of the first solder bump or the second solder bump.

The light emitting diode may further include a substrate disposed under the first conductivity type semiconductor layer, and the shortest distance in a lateral direction between the first bump pad or the second bump pad and an edge of the substrate may be equal to or greater than the thicknesses of the first solder bump and the second solder bump.

The light emitting diode may further include: a transparent conductive oxide layer electrically connected to the second conductivity type semiconductor layer; a dielectric layer covering the conductive oxide layer, and having a plurality of openings exposing the conductive oxide layer; a metal reflection layer disposed on the dielectric layer, and connected to the conductive oxide layer through the openings of the dielectric layer; a lower insulation layer disposed on the metal reflection layer, and including a first opening exposing the first conductivity type semiconductor layer and a second opening exposing the metal reflection layer; a first pad metal layer disposed on the lower insulation layer, and electrically connected to the first conductivity type semiconductor layer through the first opening of the lower insulation layer; and a second pad metal layer disposed on the lower insulation layer, and electrically connected to the second conductivity type semiconductor layer through the second opening of the lower insulation layer, in which the openings of the upper insulation layer may expose the first pad metal layer and the second pad metal layer.

In some exemplary embodiments, the light emitting diode may further includes: a substrate; and a plurality of light emitting cells disposed on the substrate, in which each of the light emitting cells may include the first conductivity type semiconductor layer, the active layer, and the second conductivity type semiconductor layer, the first bump pad may be electrically connected to the first conductivity type semiconductor layer of one of the plurality of light emitting cells, and the second bump pad may be electrically connected to the second conductivity type semiconductor layer of another one of the plurality of light emitting cells.

In an exemplary embodiment, the light emitting diode may further include a dummy bump pad disposed on another one of the plurality of light emitting cells, in which the dummy bump pad may be electrically spaced apart from the light emitting cells.

In another exemplary embodiment, the first bump pad and the second bump pad may be disposed over at least two light emitting cells, respectively.

Furthermore, the first and second bump pads may include a region having a narrow width in a region between the light emitting cells.

A light emitting diode according to another exemplary embodiment may include: a substrate; a first conductivity type semiconductor layer disposed on the substrate an active layer disposed on the first conductivity type semiconductor layer, a second conductivity type semiconductor layer disposed on the active layer; an upper insulation layer disposed on the second conductivity type semiconductor layer, and having openings for allowing electrical connection, and first and second solder bumps disposed on the upper insulation layer, and electrically connected to the first and second conductivity type semiconductor layers through the openings of the upper insulation layer, respectively, in which each of the first and second solder bumps may have a thickness within a range of about 10 μm to about 100 μm.

In addition, the first solder bump and the second solder bump may have an inclined side surface, and an inclination angle of the inclined side surface may be in a range of 65 degrees to 75 degrees with respect to a bottom surface thereof.

Furthermore, an interval between the first solder bump and the second solder bump may be 2 times or more and 10 times or less of the thickness of the first solder bump or the second solder bump.

The shortest distance in a lateral direction between the first solder bump or the second solder bump and the substrate may be equal to or greater than ½ of the interval between the first solder bumps and the second solder bumps.

A light emitting device according to another exemplary embodiment may include a mounting surface having connection pads; and a light emitting diode mounted on the mounting surface through solders, in which the light emitting diode may include a first conductivity type semiconductor layer; an active layer disposed on the first conductivity type semiconductor layer, a second conductivity type semiconductor layer disposed on the active layer; a first bump pad electrically connected to the first conductivity type semiconductor layer, and a second bump pad electrically connected to the second conductivity type semiconductor layer, in which the solders may bond the connection pads and the first and second bump pads, and the solders may have thicknesses within a range of 10 times to 80 times of thicknesses of the first and second bump pads.

The light emitting diode may further include an upper insulation layer located between the second conductivity type semiconductor layer and the first and second bump pads, and having openings for allowing electrical connection.

Moreover, the light emitting diode may further include a transparent conductive oxide layer electrically connected to the second conductivity type semiconductor layer, a dielectric layer covering the conductive oxide layer, and having a plurality of openings exposing the conductive oxide layer, a metal reflection layer disposed on the dielectric layer, and connected to the conductive oxide layer through the openings of the dielectric layer, a lower insulation layer disposed on the metal reflection layer, and including a first opening exposing the first conductivity type semiconductor layer and a second opening exposing the metal reflection layer, a first pad metal layer disposed on the lower insulation layer, and electrically connected to the first conductivity type semiconductor layer through the first opening of the lower insulation layer, and a second pad metal layer disposed on the lower insulation layer, and electrically connected to the second conductivity type semiconductor layer through the second opening of the lower insulation layer, in which the openings of the upper insulation layer may expose the first pad metal layer and the second pad metal layer.

A light emitting diode according to another exemplary embodiment includes a substrate, at least four light emitting cells disposed on the substrate, each of the light emitting cells including a first conductivity type semiconductor layer, an active layer, and a second conductivity type semiconductor layer, and at least two solder bumps disposed on the light emitting cells, in which the at least four light emitting cells include at least two light emitting cells disposed near one edge of the substrate and at least two light emitting cells disposed near the opposite edge of the substrate, a solder bump(s) is provided on two or more light emitting cells among the at least two light emitting cells disposed near one edge of the substrate, and a solder bump(s) is provided on two or more light emitting cells among the at least two light emitting cells disposed near the opposite edge of the substrate.

The solder bumps may be arranged in a symmetrical structure to stably mount the light emitting diode.

Meanwhile, the at least two solder bumps may include: a first solder bump electrically connected to one light emitting cell; and a second solder bump electrically connected to another light emitting cell.

Further, the light emitting diode may further include a first bump pad located between the first solder bump and the light emitting cell, and a second bump pad located between the second solder bump and the light emitting cell, in which the first and second solder bumps may have thicknesses within a range of 10 times to 80 times of thicknesses of the first and second bump pads, respectively.

Hereinafter, exemplary embodiments of the present disclosure will be described in detail with reference to the accompanying drawings.

Figure 2:
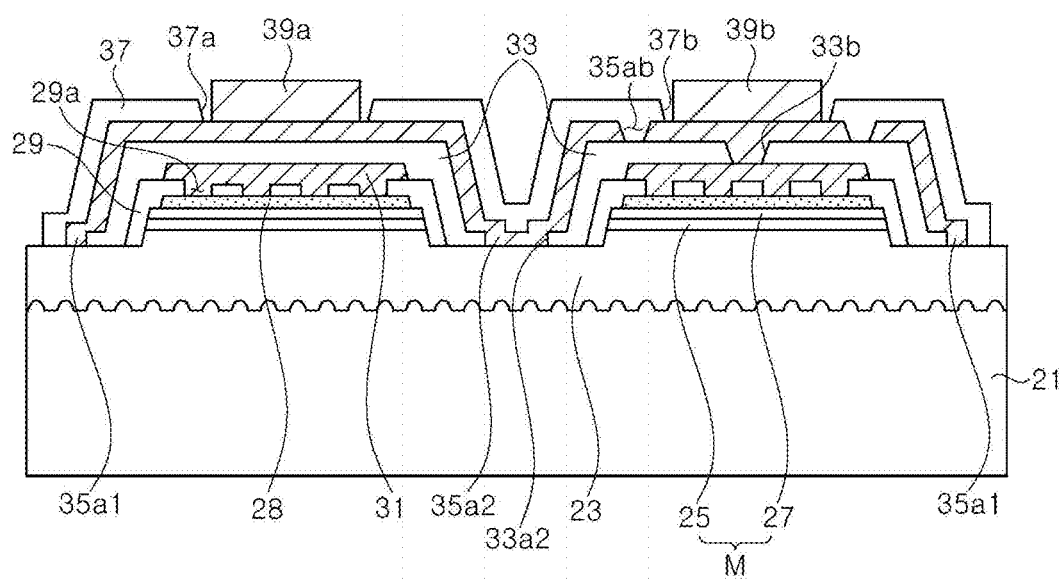
FIG. 2 is a cross-sectional view taken along line A-A of FIG. 1.

FIG. 1 is a schematic plan view illustrating a light emitting diode according to an exemplary embodiment, and FIG. 2 is a cross-sectional view taken along line A-A of FIG. 1.

Referring to FIGS. 1 and 2, the light emitting diode includes a substrate 21, a first conductivity type semiconductor layer 23, an active layer 25, a second conductivity type semiconductor layer 27, and a conductive oxide layer 28, a dielectric layer 29, a metal reflection layer 31, a lower insulation layer 33, a first pad metal layer 35a, a second pad metal layer 35b, and an upper insulation layer 37. Furthermore, the light emitting diode may further include a first bump pad 39a and a second bump pad 39b.

The substrate 21 is not particularly limited as long as it is a substrate capable of growing a gallium nitride-based semiconductor layer. The substrate 21 may be one of various substrates, such as a sapphire substrate, a gallium nitride substrate, a SiC substrate, or the like, and may be a patterned sapphire substrate. The substrate 21 may have a rectangular or square shape as seen in plan view, but the inventive concepts are not necessarily limited thereto. A size of the substrate 21 is not particularly limited and may be selected in various ways.

The first conductivity type semiconductor layer 23 is disposed on the substrate 21. The first conductivity type semiconductor layer 23 is a layer grown on the substrate 21, which may be a gallium nitride-based semiconductor layer. The first conductivity type semiconductor layer 23 may be a gallium nitride-based semiconductor layer doped with an impurity, for example, Si.

In the illustrated exemplary embodiment, an edge of the first conductivity type semiconductor layer 23 is flush with an edge of the substrate 21. However, the inventive concepts are not limited thereto, and the first conductivity type semiconductor layer 23 may be located inside a region surrounded by the edge of the substrate 21. In this case, a partial region of an upper surface of the substrate 21 may be exposed along a periphery of the first conductivity type semiconductor layer 23.

A mesa M is disposed on the first conductivity type semiconductor layer 23. The mesa M may be disposed within an inner region surrounded by the first conductivity type semiconductor layer 23, and thus, regions near the edge of the first conductivity type semiconductor layer 23 are not covered by the mesa M, but exposed to the outside.

The mesa M includes the active layer 25 and the second conductivity type semiconductor layer 27. The active layer 25 is interposed between the first conductivity type semiconductor layer 23 and the second conductivity type semiconductor layer 27. The active layer 25 may have a single quantum well structure or a multiple quantum well structure. A composition and a thickness of the well layer in the active layer 25 determines a wavelength of light generated. In particular, it is possible to provide an active layer that generates ultraviolet light, blue light or green light by controlling the composition of the well layer. In the illustrated exemplary embodiment, the active layer 25 may generate ultraviolet or blue light of 500 nm or less, and further, may generate visible light within a range of 400 nm to 470 nm.

Meanwhile, the second conductivity type semiconductor layer 27 may be a gallium nitride-based semiconductor layer doped with a p-type impurity, for example, Mg. A concentration of the p-type impurity in the second conductivity type semiconductor layer 27 may be in a range of, for example, $8 \times 10^{18}$ to $4 \times 10^{21}$/cm$^3$. In particular, the concentration of the p-type impurity in the second conductivity type semiconductor layer 27 may have a concentration profile that varies with a thickness within the above range.

Meanwhile, each of the first conductivity type semiconductor layer 23 and the second conductivity type semiconductor layer 27 may be a single layer, but the inventive concepts are not limited thereto, and may be a multilayer, or may include a superlattice layer. The first conductivity type semiconductor layer 23, the active layer 25, and the second conductivity type semiconductor layer 27 may be formed by growing on the substrate 21 in a chamber using a known method such as metal organic chemical vapor deposition (MOCVD) process or a molecular beam epitaxy (MBE) process.

In the mesa M, an indentation 30 penetrating into the inside may be formed as shown in FIG. 1, and an upper surface of the first conductivity type semiconductor layer 23 may be exposed by the indentation 30. The indentation 30 may be formed lengthily inside the mesa M from one edge of the mesa M toward another edge opposite to the one edge. A length of the indentation 30 is not particularly limited, but may be ½ or longer than a length of the mesa M. Further, although two indentations 30 are shown in FIG. 1, the number of indentations 30 may be one or three or more. As the number of indentations 30 increases, the number of internal contact portions 35a2 of the first pad metal layer 35a increases, which will be described later, thereby improving a current spread performance.

Meanwhile, the indentation 30 has an end portion having a widened width and a round shape, as shown in FIG. 1. The lower insulation layer 33 may be patterned in a similar shape by making the shape of the end portion of the indentation 30 in this manner. In particular, in a case that the lower insulation layer 33 includes a distributed Bragg reflector, FIG. 1 show that a width is not widened at the end portion. Without a widened width, a severe double step may be formed on a sidewall of the distributed Bragg reflector, and cracks are likely to occur in the first pad metal layer 35a (including 35a1, 35a2) since an inclination angle of the sidewall increases. As such, the shape of the end portion of the indentation 30 and that of the end portion of a first opening 33a2 of the lower insulation layer 33 are made as in the illustrated exemplary embodiment, and thus, an edge of the lower insulation layer 33 is formed to have a gentle inclination angle, thereby improving a yield of the light emitting diode.

In the exemplary embodiment, although it has illustrated and described that the indentation 30 is formed in the mesa M, but the mesa M may have at least one via hole passing through the second conductivity type semiconductor layer 27 and the active layer 25 instead of the indentation 30.

Meanwhile, the conductive oxide layer 28 is disposed over the mesa M to contact the second conductivity type semiconductor layer 27. The conductive oxide layer 28 may be disposed over almost an entire region of the mesa M in an upper region of the mesa M. For example, the conductive oxide layer 28 may cover 80% or more, and further, 90% or more of the upper region of the mesa M.

The conductive oxide layer 28 is formed of an oxide layer that transmits light generated in the active layer 25. The conductive oxide layer 28 may be formed of, for example, indium tin oxide (ITO), ZnO, or the like. The conductive oxide layer 28 is formed to have a thickness sufficient to make ohmic contact with the second conductivity type semiconductor layer 27, and for example, may be formed to have a thickness within a thickness range of about 3 nm to about 50 nm, specifically, within a thickness range of about 6 nm to about 30 nm. When the thickness of the conductive oxide layer 28 is too thin, a sufficient ohmic characteristic may not be provided, and a forward voltage increases. In addition, when the thickness of the conductive oxide layer 28 is too thick, loss due to light absorption occurs, thereby reducing luminous efficiency.

Meanwhile, the dielectric layer 29 covers the conductive oxide layer 28. Furthermore, the dielectric layer 29 may cover side surfaces of the second conductivity type semiconductor layer 27 and the active layer 25. An edge of the dielectric layer 29 may be covered with the lower insulation layer 33. Accordingly, the edge of the dielectric layer 29 is located farther from the edge of the substrate 21 than the edge of the lower insulation layer 33. Accordingly, as will be described later, a portion of the lower insulation layer 33 may be in contact with the first conductivity type semiconductor layer 23 around the mesa M. Furthermore, the dielectric layer 29 may be defined in an upper region of the second conductivity type semiconductor layer 27, and the lower insulation layer 33 may be in contact with the side surfaces of the second conductivity type semiconductor layer 27 and the active layer 25.

The dielectric layer 29 has openings 29a exposing the conductive oxide layer 28. A plurality of openings 29a may be disposed over the conductive oxide layer 28. The openings 29a are used as connection passages so that the metal reflection layer 31 can connect to the conductive oxide layer 28. The dielectric layer 29 also exposes the first conductivity type semiconductor layer 23 around the mesa M, and exposes the first conductivity type semiconductor layer 23 in the indentation 30.

The dielectric layer 29 is formed of an insulating material having an index of refraction lower than those of the second conductivity type semiconductor layer 27 and the conductive oxide layer 28. The dielectric layer 29 may be formed of, for example, $SiO_2$.

A thickness of the dielectric layer 29 may be in a range of about 200 nm to about 1000 nm, and specifically may have a thickness in a range of about 300 nm to about 800 nm. When the thickness of the dielectric layer 29 is less than 200 nm, a forward voltage is high and a light output is low, which is not favorable. Meanwhile, when the thickness of the dielectric layer 29 exceeds 400 nm, the light output is saturated, and the forward voltage is likely to increase again. Therefore, it is advantageous that the thickness of the dielectric layer 29 does not exceed 1000 nm, and particularly, may be 800 nm or less.

The metal reflection layer 31 is disposed on the dielectric layer 29 and is connected to the conductive oxide layer 28 through the openings 29a. The metal reflection layer 31 includes a reflective metal, and may include Ag or Ni/Ag, for example. Further, the metal reflection layer 31 may include a barrier layer for protecting the reflective metal material layer, such as Ni, and may also include an Au layer to prevent oxidation of the metallic layers. Furthermore, to improve the adhesion of the Au layer, a Ti layer may be included under the Au layer. The metal reflection layer 31 is in contact with an upper surface of the dielectric layer 29, and thus, the thickness of the dielectric layer 29 is equal to a separation distance between the conductive oxide layer 28 and the metal reflection layer 31.

Since the ohmic contact is formed with the conductive oxide layer 28, and the metal reflection layer 31 is disposed on the dielectric layer 29, it is possible to prevent an increase in ohmic resistance due to solder or the like. Further, since the conductive oxide layer 28, the dielectric layer 29, and the metal reflection layer 31 are disposed on the second conductivity type semiconductor layer 27, a reflectance of light may be improved, thereby improving luminous efficiency.

The lower insulation layer 33 covers the mesa M and the metal reflection layer 31. The lower insulation layer 33 may also cover the first conductivity type semiconductor layer 23 along a periphery of the mesa M, and may cover the first conductivity type semiconductor layer 23 in the indentation 30 inside the mesa M. The lower insulation layer 33 particularly covers a side surface of the mesa M. The lower insulation layer 33 may also cover the dielectric layer 29.

The lower insulation layer 33 has first openings 33a1 and 33a2 exposing the first conductivity type semiconductor layer 23 and a second opening 33b exposing the metal reflection layer 31. The first opening 33a1 exposes the first conductivity type semiconductor layer 23 along the periphery of the mesa M, and the first opening 33a2 exposes the first conductivity type semiconductor layer 23 in the indentation 30. When the via hole is formed instead of the indentation 30, the first opening 33a2 exposes the first conductivity type semiconductor layer 23 in the via hole.

As shown in FIG. 1, the first opening 33a1 and the first opening 33a2 may be connected to each other. However, the inventive concepts are not limited thereto, and the first openings 33a1 and 33a2 may be spaced apart from each other.

In the exemplary embodiment, the first opening 33a1 of the lower insulation layer 33 is formed to expose all of peripheral regions thereof including the edge of the first conductivity type semiconductor layer 23. However, the inventive concepts are not limited thereto, and the first opening 33a1 of the lower insulation layer 33 may be formed in a band shape along the periphery of the mesa M. In this case, the edge of the first conductivity type semiconductor layer 23 may be covered with the lower insulation layer 33 or flush with the edge of the lower insulation layer 33.

The second opening 33b exposes the metal reflection layer 31. A plurality of second openings 33b may be formed, and these second openings 33b may be disposed near one edge of the substrate 21 to face the indentation 30. Locations of the second openings 33b will be described again later.

Meanwhile, in some forms, the lower insulation layer 33 includes a distributed Bragg reflector. The distributed Bragg reflector may be formed by stacking insulation layers having different indices of refraction from one another. For example, the distributed Bragg reflector may be formed by alternately stacking a silicon nitride layer and a silicon oxide layer one above another. The lower insulation layer 33 may also include a capping layer. The capping layer may function as a protection layer covering an upper surface of the distributed Bragg reflector to protect the distributed Bragg reflector. The capping layer also improves adhesion of the pad metal layers 35a and 35b disposed on the distributed Bragg reflector. A specific structure of the lower insulation layer 33 will be described later with reference to FIGS. 3 through 8.

The first pad metal layer 35a (35a1, 35a2) is disposed on the lower insulation layer 33, and is insulated from the mesa M and the metal reflection layer 31 by the lower insulation layer 33. The first pad metal layer 35a contacts the first conductivity type semiconductor layer 23 through the first openings 33a1 and 33a2 of the lower insulation layer 33. The first pad metal layer 35a may include an external contact portion 35a1 in contact with the first conductivity type semiconductor layer 23 along the periphery of the mesa M, and an internal contact portion 35a2 in contact with the first conductivity type semiconductor layer 23 in the indentation 30 or a via hole. The external contact portion 35a1 contacts the first conductivity type semiconductor layer 23 near the edge of the substrate 21 along the periphery of the mesa M, and the internal contact portion 35a2 contacts the first conductivity type semiconductor layer 23 in a region surrounded by the external contact portion 35a1. The external contact portion 35a1 and the internal contact portion 35a2 may be connected to each other, but the inventive concepts are not limited thereto, and may be spaced apart from each other. In addition, the external contact portion 35a1 may continuously contact the first conductivity type semiconductor layer 23 along the periphery of the mesa M, but the inventive concepts are not limited thereto, and a plurality of external contact portions 35a1 is disposed apart from one another.

The second pad metal layer 35b is disposed in the upper region of the mesa M on the lower insulation layer 33, and is electrically connected to the metal reflection layer 31 through the second opening 33b of the lower insulation layer 33. The second pad metal layer 35b may be surrounded by the first pad metal layer 35a, and a boundary region 35ab may be formed therebetween. The lower insulation layer 33 is exposed in the boundary region 35ab, and the boundary region 35ab is covered with the upper insulation layer 37 which will be described later.

The first pad metal layer 35a and the second pad metal layer 35b may be formed together with an identical material in an identical process. The first and second pad metal layers 35a and 35b may include an ohmic reflection layer such as an Al layer, and the ohmic reflection layer may be formed on an adhesive layer such as Ti, Cr, Ni, or the like. In addition, a protection layer having a single layer structure or a composite layer structure such as Ni, Cr, or Au may be formed on the ohmic reflection layer. The first and second pad metal layers 35a and 35b may have a multi-layered structure of, for example, Cr/Al/Ni/Ti/Ni/Ti/Au/Ti.

The upper insulation layer 37 covers the first and second pad metal layers 35a and 35b. In addition, the upper insulation layer 37 may cover the first conductivity type semiconductor layer 23 along the periphery of the mesa M. In the exemplary embodiment, the upper insulation layer 37 may expose the first conductivity type semiconductor layer 23 along the edge of the substrate 21. However, the inventive concepts are not limited thereto, and the upper insulation layer 37 may cover all of the first conductivity type semiconductor layer 23, or may be flush with the edge of the substrate 21.

Meanwhile, the upper insulation layer 37 has a first opening 37a exposing the first pad metal layer 35a and a second opening 37b exposing the second pad metal layer 35b. The first opening 37a and the second opening 37b may be disposed in the upper region of the mesa M, and may be disposed to face each other. In particular, the first opening 37a and the second opening 37b may be disposed close to both edges of the mesa M.

The upper insulation layer 37 may be formed of a single layer of $SiO_2$ or $Si_3N_4$, but the inventive concepts are not limited thereto, and may include a $SiO_2$—$TiO_2$ mixed layer or an $MgF_2$ layer. Since the $SiO_2$—$TiO_2$ mixed layer or the $MgF_2$ layer has a favorable waterproof characteristic, reliability of the light emitting diode may be improved in a high temperature and high humidity environment. In addition, the upper insulation layer 37 may have a multi-layered structure including a silicon nitride layer and a silicon oxide layer, and may include a distributed Bragg reflector in which a silicon oxide layer and a titanium oxide layer are alternately stacked one above another.

The first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 1, the first bump pad 39a may be disposed in the first opening 37a of the upper insulation layer 37, and the second bump pad 39b may be disposed in the second opening 37b of the upper insulation layer 37. However, the inventive concepts are not limited thereto, and the first bump pad 39a and the second bump pad 39b may cover all of the first opening 37a and the second opening 37b and seal them, respectively. Further, the second bump pad 39b may cover an upper region of the second opening 33b of the lower insulation layer 33. The second bump pad 39b may cover all of the second openings 33b of the lower insulation layer 33, but the inventive concepts are not limited thereto, and a portion of the openings 33b may be located outside the second bump pad 39b.

In addition, as shown in FIG. 1, the second bump pad 39b may be disposed within an upper region of the second pad metal layer 35a. However, the inventive concepts are not limited thereto, and a portion of the second bump pad 39b may be overlapped with the first pad metal layer 35a. However, the upper insulation layer 37 may be disposed between the first pad metal layer 35a and the second bump pad 39b to insulate them.

According to the exemplary embodiment, a reflection structure of the conductive oxide layer 28, the dielectric layer 29, and the metal reflection layer 31 is used instead of a conventional ohmic reflection layer. Accordingly, it is possible to block intrusion of a bonding material such as solder into a contact region, and to secure a stable ohmic contact resistance, thereby improving the reliability of the light emitting diode. Furthermore, by making the dielectric layer 29 thicker than 300 nm, a high light output and a low forward voltage may be achieved.

Figure 3:
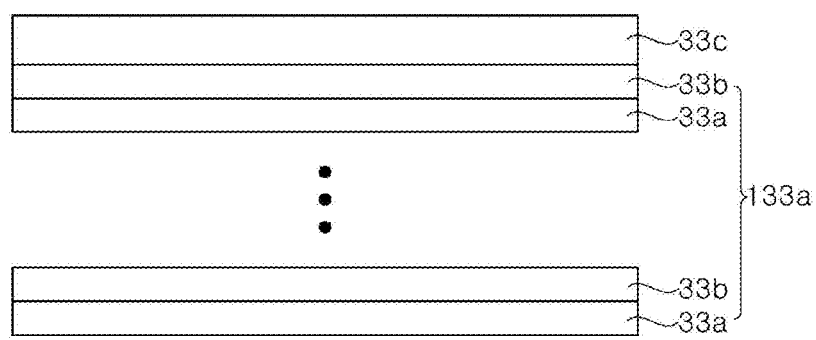
FIG. 3 is a schematic cross-sectional view illustrating an example of a lower insulation layer.
Figure 4:
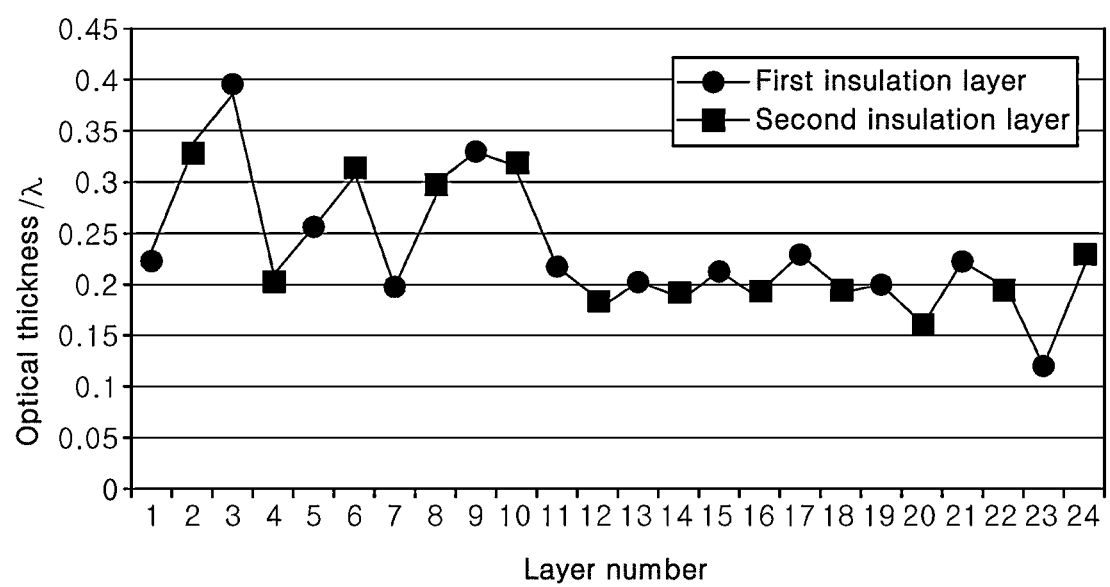
FIG. 4 is a schematic graph illustrating thicknesses of layers of an example of a distributed Bragg reflector in the lower insulation layer of FIG. 3.
Figure 5:
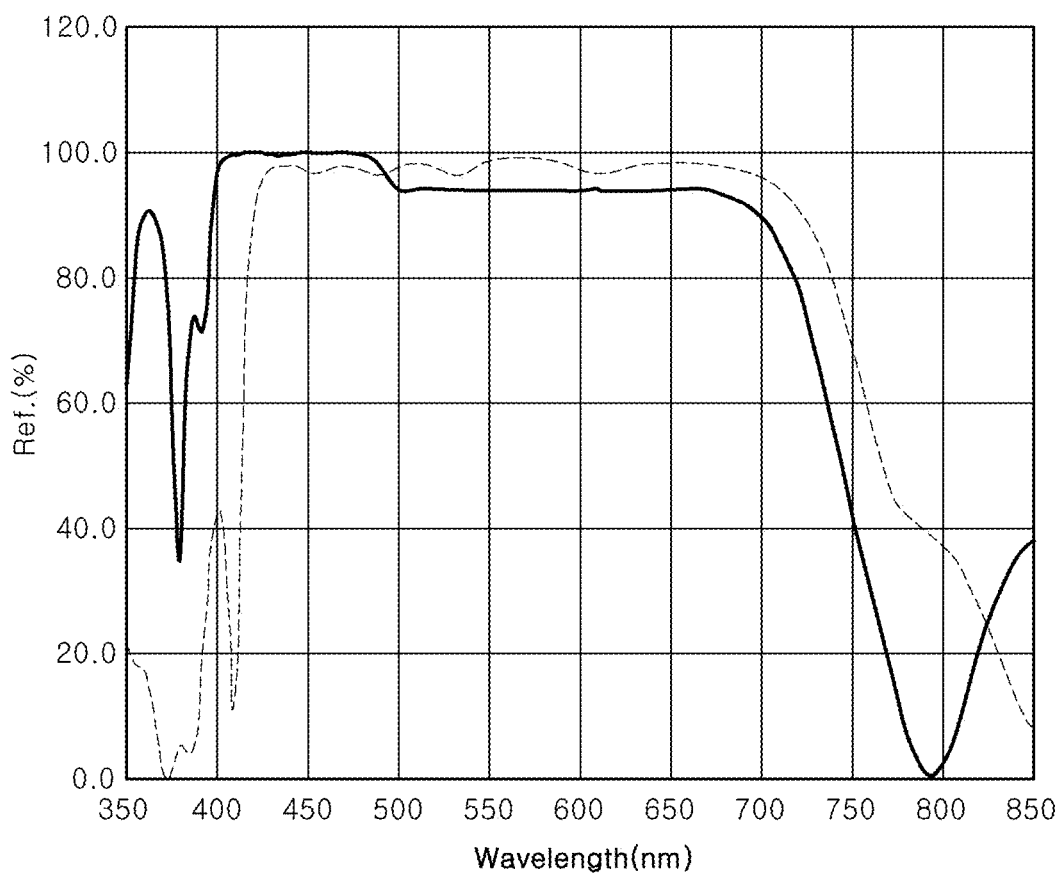
FIG. 5 is a simulation graph illustrating a reflectance of the lower insulation layer employing the distributed Bragg reflector of FIG. 4.

FIG. 3 is a schematic cross-sectional view illustrating an example of a lower insulation layer 33, and FIG. 4 is a schematic graph illustrating thicknesses of layers of an example of a distributed Bragg reflector in the lower insulation layer of FIG. 3. FIG. 5 is a simulation graph illustrating a reflectance of the lower insulation layer employing the distributed Bragg reflector of FIG. 4.

First, referring to FIG. 3, the lower insulation layer 33 may include a distributed Bragg reflector 133a including a plurality of pairs of a first insulation layer 33a having a first index of refraction, a second insulation layer 33b having a second index of refraction and a capping layer 33c.

The first insulation layer 33a may have a lower index of refraction than that of the second insulation layer 33b, and for example, may be formed of a silicon oxide layer (index of refraction: about 1.47). The second insulation layer 33b may be formed of, for example, a titanium oxide layer (index of refraction: about 2.39).

The first insulation layer 33a and the second insulation layer 33b may be formed, for example, in 12 pairs, as shown in FIG. 4, and the first insulation layers 33a in the distributed Bragg reflector may have different thicknesses from one another, and the second insulation layers 33b may also have different thicknesses from one another.

In particular, since the thicknesses of the first insulation layers 33a and the second insulation layers 33b are adjusted, a light emitting diode having a relatively high light efficiency may be provided while reducing an overall thickness of the distributed Bragg reflector.

For example, the first insulation layers 33a and the second insulation layers 33b may exhibit relatively high reflectance in a first wavelength region including a peak wavelength of light generated in the active layer 25, and may be formed to exhibit relatively low reflectance in a region including a longer wavelength than the first wavelength region. FIG. 4 shows an example of optical thicknesses according to an order of layers of the first insulation layers 33a and the second insulation layers 33b. Herein, a central wavelength λ was set to 554 nm in consideration of the visible region.

As shown in FIG. 4, the optical thicknesses of the first insulation layers 33a and the second insulation layers 33b are different from each other, and in particular, the layers located in a lower region of the distributed Bragg reflector (e.g., the first to tenth layers) have a greater thickness deviation than layers (e.g., the eleventh to twenty fourth layers) located in an upper region thereof. For example, the layers located in the lower region include layers having an optical thickness of 0.3λ or greater and layers having an optical thickness of 0.25λ or less. In contrast, the layers located in the upper region generally have a thickness of 0.25λ or less.

Moreover, in the illustrated exemplary embodiment, a number of layers having the optical thickness of 0.25λ or less may be more than that of layers having the optical thickness of 0.25λ or more. As such, it is possible to form wavelength bands having different reflectances within a stop band of the distributed Bragg reflector, and to have higher reflectances in a region of relatively short wavelengths.

Figure 6:
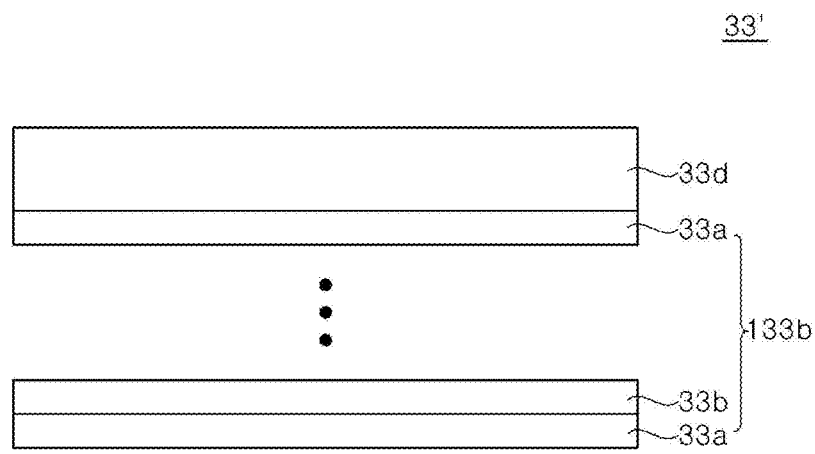
FIG. 6 is a schematic cross-sectional view illustrating another example of a lower insulation layer.

Meanwhile, the capping layer 33c may be formed of the same material as that of the first insulation layer 33a, for example, a $SiO_2$ layer. However, the capping layer 33c is not limited to $SiO_2$. The capping layer 33c may be a mixed layer of at least two kinds of oxides including $SiO_2$. Examples of the mixed layer may be $SiO_2$—$TiO_2$, $SiO_2$—$SnO_2$, $SiO_2$—ZnO, or the like. In particular, FIG. 6 shows that a capping layer 33d is a $SiO_2$—$TiO_2$ mixed layer or an $MgF_2$ layer, which will be described later.

FIG. 5 is a simulation graph illustrating a reflectance of the lower insulation layer 33 including the distributed Bragg reflector having the optical thickness of FIG. 4 and the $SiO_2$ capping layer 33c. Herein, a simulation graph of a lower insulation layer including a distributed Bragg reflector formed to have a high reflectance over a wide wavelength region of a conventional visible region is shown with a dotted line, and the simulation graph according to an exemplary embodiment of the present disclosure is shown with a solid line. The simulation was carried out to show reflectances on a side of a glass substrate after alternately stacking the first insulation layers 33a and the second insulation layers 33b on the glass substrate (n: about 1.52) one above another and finally forming the $SiO_2$ capping layer 33c to have a thickness of about 120 nm.

Referring to FIG. 5, the lower insulation layer including the conventional distributed Bragg reflector exhibits generally high reflectances in the stop band region, and generally exhibits constant reflectances although several ripples are observed in the stop band. On the contrary, it can be seen that the graph of the lower insulation layer 33 according to certain exemplary embodiments of the present disclosure is divided into a first wavelength region exhibiting relatively high reflectances within the stop band and a second wavelength region exhibiting relatively lower reflectances than those of the first wavelength region.

Herein, the present disclosure introduces a "high reflection wavelength band" similar to the stop band to describe the present disclosure because it is difficult to define the stop band. In the present specification, the "high reflection wavelength band" is defined as a wavelength band continuously exhibiting reflectances of 90% or more. Accordingly, the high reflection wavelength band of the lower insulation layer according to the prior art is a region between about 420 nm and about 750 nm, and the high reflection wavelength band according to an exemplary embodiment is a region between about 400 nm and about 700 nm.

By adjusting materials and thicknesses of the first insulation layer 33a, the second insulation layer 33b, and the capping layer 33c, the high reflection wavelength band may be adjusted to cover a wide wavelength region of the visible region.

Meanwhile, the conventional lower insulation layer exhibits the reflectance having an approximately symmetrical shape with respect to a central wavelength within the high reflection wavelength band, but the lower insulation layer 33 according to exemplary embodiments of the present disclosure exhibits a distinct asymmetrical reflectance with respect to the central wavelength. That is, the lower insulation layer 33 according to the exemplary embodiments of the present disclosure includes the first wavelength region that exhibits relatively high reflectances in a shorter wavelength region than the central wavelength region within the high reflection wavelength band compared to those of other wavelength regions. The first wavelength region in FIG. 5 may have a wavelength range of about 420 nm to about 480 nm and exhibits reflectances of 98% or more in this range. Furthermore, the first wavelength region in FIG. 5 has reflectance of 90% or more in a wavelength range of about 500 nm to about 700 nm.

In the illustrated exemplary embodiment, a reason for setting to have the relatively high reflectance in the wavelength range of 420 nm to 480 nm is to obtain light of high reflectance with respect to light emitted from the active layer 25, assuming that a peak wavelength of light emitted from the active layer is about 450 nm. Accordingly, the first wavelength region exhibiting the reflectance of 98% or more may be changed depending on and in consideration of the wavelength of light generated in the active layer 25.

Meanwhile, a wavelength range exhibiting relatively low reflectances within the high reflection wavelength band is also not limited to 500 nm to 700 nm as shown in FIG. 5, and it may be changed to another wavelength range. However, the visible region of 554 nm or more, which is the central wavelength, may be set to have a relatively low reflectance compared to that of the first wavelength region. Also, the first wavelength region may be limited to a region of wavelengths shorter than the central wavelength of 554 nm.

Within the high reflection wavelength band, since the first wavelength region is set to have the relatively high reflectances and the other regions is set to have the relatively low reflectances, light loss of the light emitting diode may be prevented while reducing an overall thickness of the distributed Bragg reflector 133a. Furthermore, by reducing the thickness of the distributed Bragg reflector 133a, a thickness of the lower insulation layer 33 in the light emitting diode may be reduced, and thus, process stability and reliability may be obtained.

Meanwhile, FIG. 5 shows the simulation graph, but an actual measured reflectance may show a slight difference from those of the simulation. Nevertheless, the lower insulation layer 33 will include the first wavelength region that exhibits the relatively high reflectances at the region of wavelengths shorter than the central wavelength region within the high reflection wavelength band.

Figure 7:
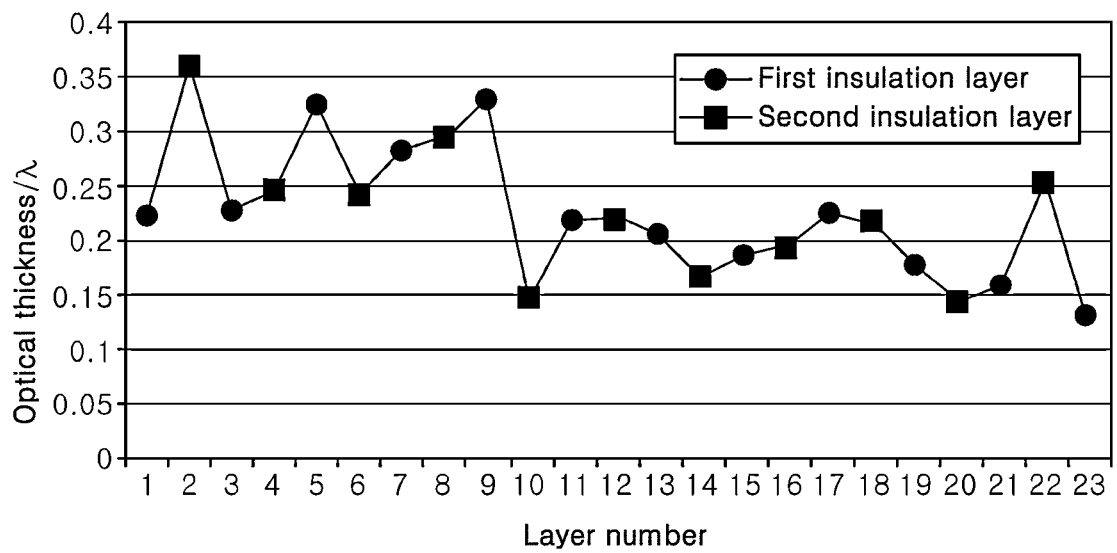
FIG. 7 is a schematic graph illustrating an example of a distributed Bragg reflector in the lower insulation layer of FIG. 6.
Figure 8:
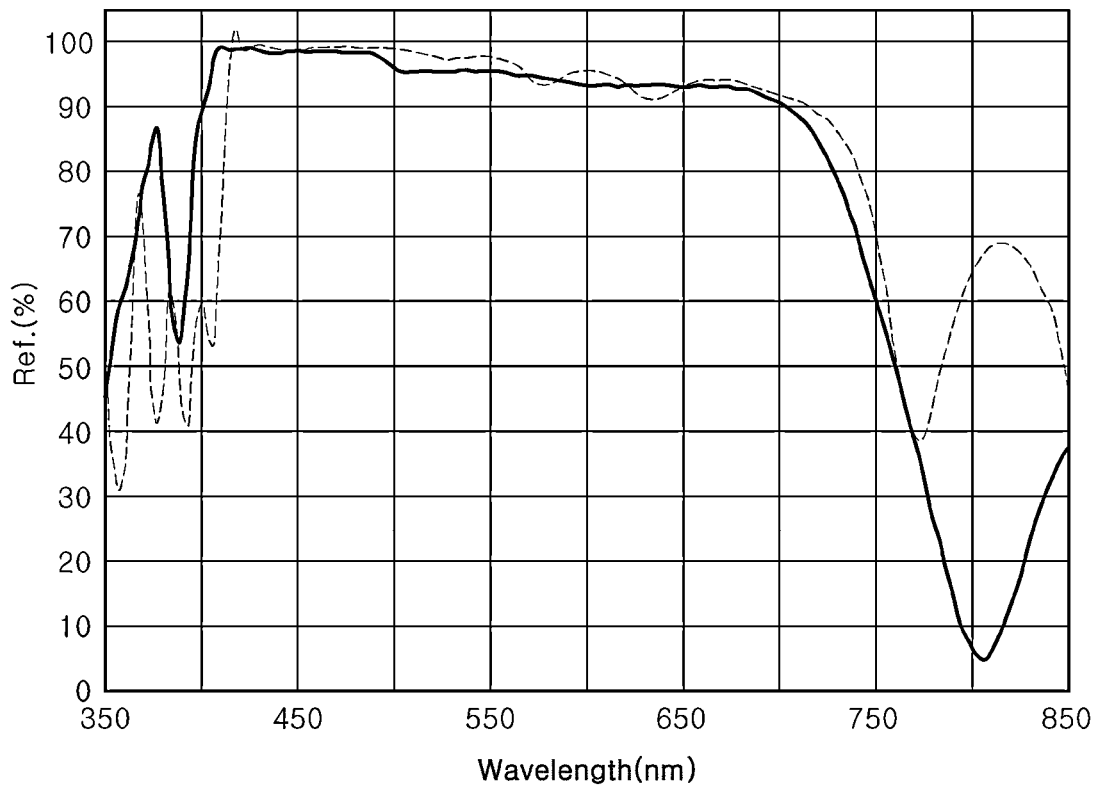
FIG. 8 is a simulation and an actual measurement graphs illustrating a reflectance of the lower insulation layer employing the distributed Bragg reflector of FIG. 6.

FIG. 6 is a schematic cross-sectional view illustrating another example of a lower insulation layer, FIG. 7 is a schematic graph illustrating an example of a distributed Bragg reflector in the lower insulation layer of FIG. 6, and FIG. 8 is a simulation and an actual measurement graph illustrating a reflectance of the lower insulation layer employing the distributed Bragg reflector of FIG. 6.

Referring to FIG. 6, a lower insulation layer 33' according to the illustrated embodiment is substantially similar to the lower insulation layer 33 of FIG. 3 except that a capping layer 33d is a waterproof capping layer for preventing moisture permeation. The capping layer 33d may include, for example, a $SiO_2$—$TiO_2$ mixed layer or an $MgF_2$ layer.

The $SiO_2$—$TiO_2$ mixed layer or the $MgF_2$ layer has a hydrophobic characteristic, thereby preventing moisture from penetrating into a distribution Bragg reflector 133b. When moisture penetrates into a distributed Bragg reflector 133b including the $TiO_2$ layer, a reflectance of the distributed Bragg reflector may rapidly deteriorate due to the $TiO_2$ layer which is vulnerable to moisture, and further, an electrical short circuit may occur through the lower insulation layer to cause a device failure. Since the waterproof capping layer 33d is employed, it is possible to protect the distributed Bragg reflector 133b, thereby improving reliability in a high humidity environment.

The $SiO_2$—$TiO_2$ mixed layer ay be formed by using a $SiO_2$ target and a $TiO_2$ target at the same time or by using a target mixed with an $SiO_2$ oxide and a $TiO_2$ oxide using electron beam deposition technology. In consideration of DBR design, a content of $TiO_2$ in the $SiO_2$—$TiO_2$ mixed layer may be about 1 mol % to about 5 mol % based on an entire mixed layer. The capping layer 33d may have a thickness of about 100 nm or more, about 200 nm or more, and further about 300 nm or more. However, since an increase in a thickness of the capping layer 33d leads to an increase in a thickness of the lower insulation layer 33', the thickness of the capping layer 33d may be limited to be, for example, about 400 nm or less.

Meanwhile, the distributed Bragg reflector 133b may have the same layer structure as that of the distributed Bragg reflector 133a, but as the capping layer 33d is formed of the $SiO_2$—$TiO_2$ mixed layer, an insulation layer right below the capping layer 33d may be a first insulation layer 33a, and thicknesses of the first insulation layers 33a and the second insulation layers 33b may be modified to be suitable for the capping layer 33d. FIG. 7 shows an optical thickness of each of the insulation layers 33a and 33b of the distributed Bragg reflector 133b.

Referring to FIG. 7, the thickness of each of the first insulation layers 33a and the second insulation layers 33b is different from the thickness described with reference to FIG. 4, but an overall configuration is substantially similar. That is, the optical thicknesses of the first insulation layers 33a and the second insulation layers 33b are different from each other, and in particular, layers (e.g., the first to the ninth layers) located in a lower region of the distributed Bragg reflector 133b have a greater thickness deviation than layers (e.g., the tenth to the twenty third layers) located in an upper region thereof. For example, the layers located in the lower region include layers having an optical thickness of $0.3\lambda$ or greater and the layers having an optical thickness of $0.25\lambda$ or less. In contrast, the layers located in the upper region generally have a thickness of $0.25\lambda$ or less, as shown in FIG. 7. Moreover, in the illustrated exemplary embodiment, there may be more layers having the optical thickness of $0.25\lambda$ or less compared to the layers having the optical thickness greater than or equal to $0.25\lambda$. As such, it is possible to form wavelength bands having different reflectances within a stop band of the distributed Bragg reflector and to have higher reflectance in a region of relatively short wavelengths.

Meanwhile, in FIG. 7, as the capping layer 33d is formed on the first insulation layer 33a, one second insulation layer 33b is omitted from the number of layers of the distributed Bragg reflector 133a, and thus, a total number of layers has decreased.

FIG. 8 shows a simulation graph (solid line) illustrating a reflectance of the lower insulation layer 33' including the distributed Bragg reflector 133b having the optical thicknesses of FIG. 7 and the capping layer 33d formed of the $SiO_2$—$TiO_2$ mixed layer of about 300 nm as the capping layer 33d and an actual measurement graph (dotted line).

The simulation was carried out to show reflectances on a side of a glass substrate after alternately stacking the first insulation layers 33a and the second insulation layers 33b on the glass substrate (n: about 1.52) and finally forming the $SiO_2$—$TiO_2$ mixed layer (n: about 1.51) as the capping layer 33d to have the thickness of about 300 nm. The actual measurement was also carried out on the side of the glass substrate after forming the lower insulation layer 33' on the glass substrate.

First, looking at the simulation graph (solid line), it shows relatively high reflectances in a range of about 405 nm to about 485 nm among high reflection wavelength bands in which a reflectance is 90% or more, and shows relatively low reflectances in a range of about 500 nm to about 700 nm. A first wavelength region exhibiting high reflectance is located in a region of wavelengths shorter than 554 nm, and a wavelength region of 554 nm to 700 nm exhibits relatively low reflectances compared to those of the first wavelength region.

Meanwhile, looking at the actual measurement graph (dotted line), it can be seen that, similar to the simulation graph, a high reflectance region and a low reflectance region are distinct, although a boundary between the high reflectance region and the low reflectance region is vague compared to that of the simulation graph.

In the actual measurement graph, relatively high reflectances are exhibited in a region of about 420 nm to about 500 nm, and relatively low reflectances are exhibited in a region of about 520 nm to about 700 nm. That is, a reflectance of a first wavelength region including a peak wavelength (e.g., 450 nm) of light generated in the active layer 25 is higher than that of the visible region of 554 nm or more which is a central wavelength.

According to the exemplary embodiments of the present disclosure, since the distributed Bragg reflectors 133a and 133b exhibit the relatively high reflectances in the specific visible region of the region that has the shorter wavelength than the central wavelength, an overall thickness of the distributed Bragg reflector does not need to be increased, and thus, thicknesses of the lower insulation layers 33 and 33' may be reduced.

Furthermore, by forming the capping layer 33d with the $SiO_2$—$TiO_2$ mixed layer or the $MgF_2$ layer, the lower insulation layer 33' may prevent moisture permeation, thereby improving the reliability of the light emitting diode under a high temperature and high humidity environment.

Meanwhile, in the illustrated exemplary embodiment, the lower insulation layer 33' has been described as including the distributed Bragg reflector 133b and the capping layer 33d, but it is also possible to apply the capping layer 33d to the conventional distributed Bragg reflector since the reliability of the light emitting diode under the high temperature and high humidity environment is achieved by the capping layer 33d.

Figure 9A:
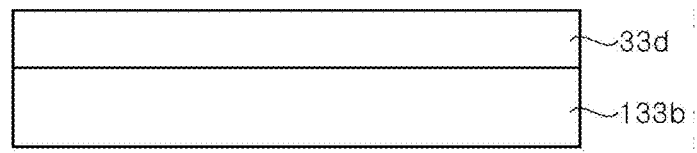
FIG. 9A is a schematic cross-sectional view illustrating a distributed Bragg reflector and a capping layer.
Figure 9B:
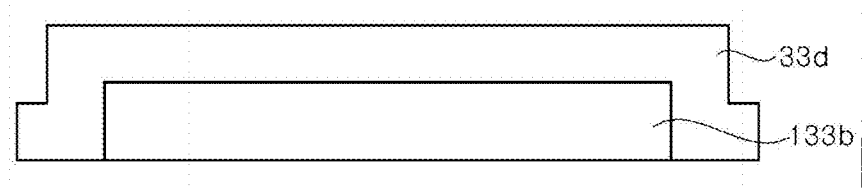
FIG. 9B is another schematic cross-sectional view illustrating a distributed Bragg reflector and a capping layer.

FIG. 9A and FIG. 9B are schematic cross-sectional views illustrating a distributed Bragg reflector 133b and a capping layer 33d.

Referring to FIG. 9A, the capping layer 33d may be located on the distributed Bragg reflector 133b, and may cover an entire upper surface of the distributed Bragg reflector 133b. The capping layer 33d may be continuously deposited after the distributed Bragg reflector 133b is deposited, and may be patterned together with the distributed Bragg reflector 133b. Accordingly, the capping layer 33d exposes side surfaces of the distributed Bragg reflector 133b.

Referring to FIG. 9B, the capping layer 33d covers the upper surface and the side surface of the distributed Bragg reflector 133b. A lower insulation layer having a structure as shown in FIG. 9B may be provided by patterning the distributed Bragg reflector 133b first, and forming the capping layer 33d on the patterned distributed Bragg reflector 133b. As such, the capping layer 33d may protect the side surface as well as the upper surface of the distributed Bragg reflector 133b.

In the exemplary embodiments of the present disclosure, it has been described that the capping layer 33d protects the distributed Bragg reflector 133b, but the above-described upper insulation layer 37 (as shown in FIGS. 1 and 2) may protect the distributed Bragg reflector 133b by covering the upper and side surfaces of the distributed Bragg reflector 133b. In that case, the upper insulation layer 37 may be formed of a $SiO_2$—$TiO_2$ mixed layer or an $MgF_2$ layer, and the capping layer 33d may be omitted.

Figure 10:
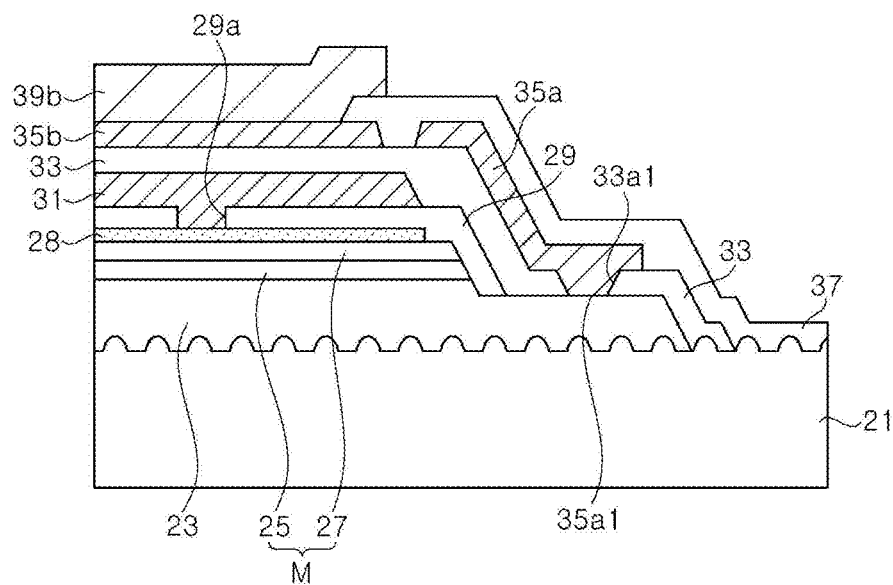
FIG. 10 is a schematic cross-sectional view illustrating a light emitting diode according to another exemplary embodiment.

FIG. 10 is a schematic cross-sectional view illustrating a light emitting diode according to another exemplary embodiment. FIG. 10 is an enlarged cross-sectional view of an edge portion of a substrate 21.

Referring to FIG. 10, the light emitting diode according to the exemplary embodiment is substantially similar to the light emitting diode described above with reference to FIGS. 1 and 2 except that an upper insulation layer 37 covers a side surface of a lower insulation layer 33.

As illustrated in FIG. 10, the first conductivity type semiconductor layer 23 may be formed to expose the edge portion of the substrate 21.

The lower insulation layer 33 may cover a side surface of the first conductivity type semiconductor layer 23, but the inventive concepts are not limited thereto, and an edge of the lower insulation layer 33 may be located on the first conductivity type semiconductor layer 23. The edge of the lower insulation layer 33 may be located outside a first pad metal layer 35a. As illustrated, an external contact portion 35a1 may be located in an opening 33a1 of the lower insulation layer 33.

The upper insulation layer 37 may be in contact with a side surface of the lower insulation layer 33, and further, may be in contact with a portion of the upper surface of the lower insulation layer 33.

In the illustrated exemplary embodiment, the lower insulation layer 33 may be identical to that described above with reference to FIG. 3 or FIG. 6, but the inventive concepts are not limited thereto and may be a lower insulation layer including a distributed Bragg reflector, for example, the lower insulation layer showing reflectance indicated by the dotted line in FIG. 5.

Meanwhile, when the lower insulation layer 33 includes the distributed Bragg reflector according to the dotted line of FIG. 5, the upper insulation layer 37 may be formed of a $SiO_2$—$TiO_2$ mixed layer or an $MgF_2$ layer, and thus, moisture permeation into the distributed Bragg reflector may be prevented.

Figure 11:
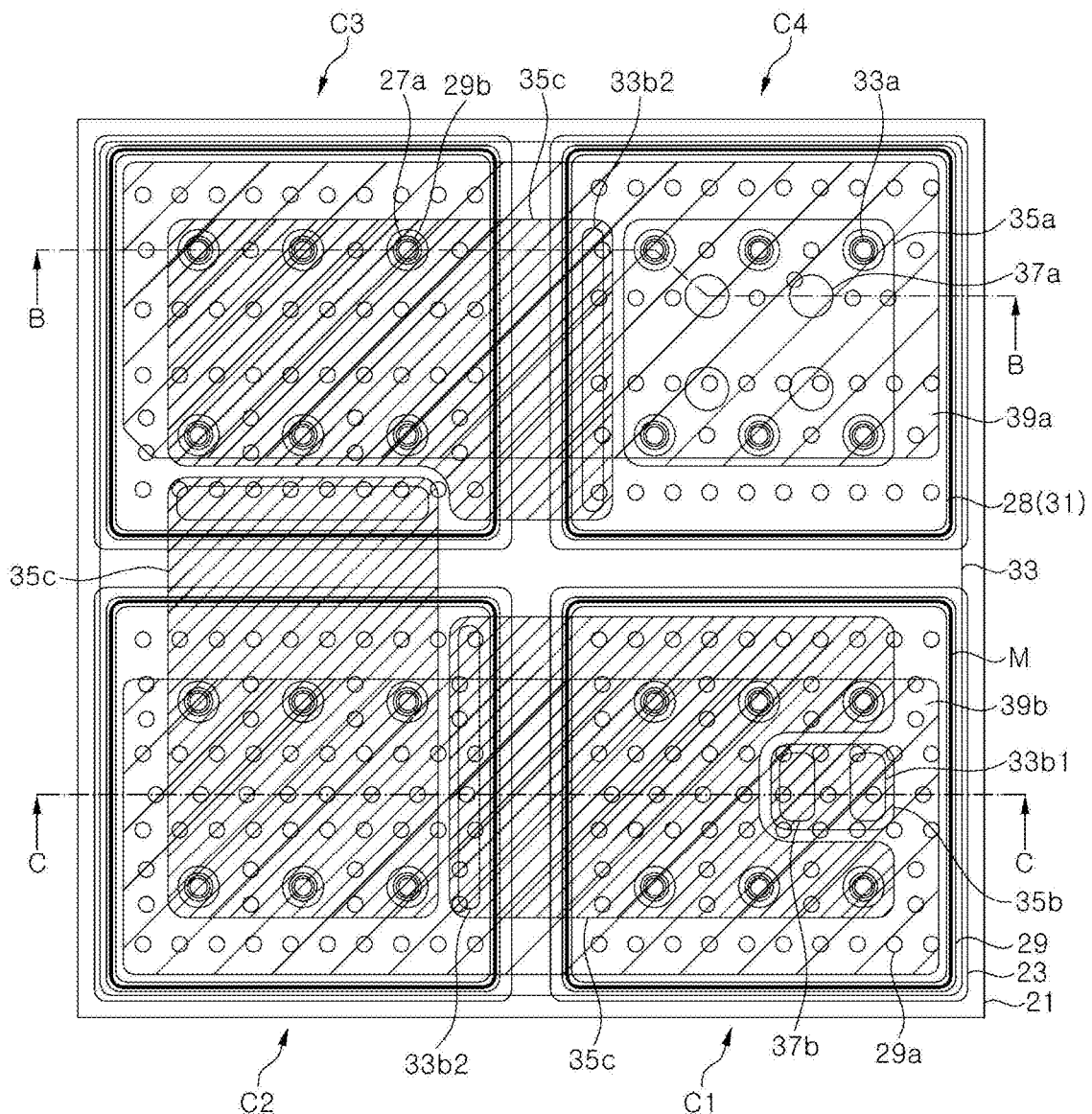
FIG. 11 is a schematic plan view illustrating a light emitting diode according to another exemplary embodiment.
Figure 12:
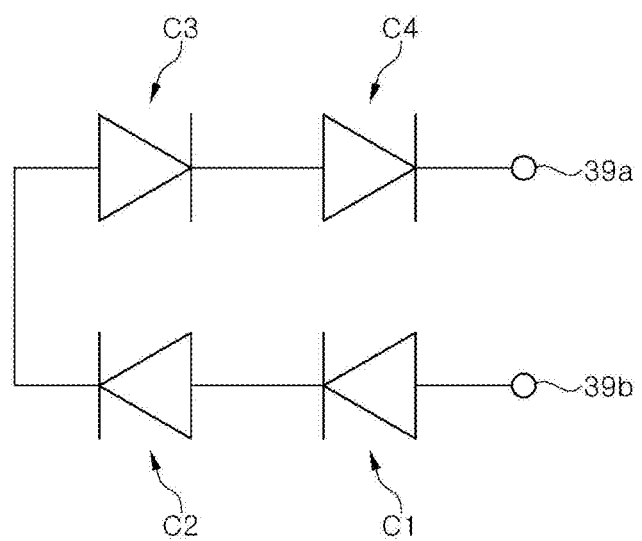
FIG. 12 is a schematic circuit diagram illustrating the light emitting diode of FIG. 11.
Figure 13:
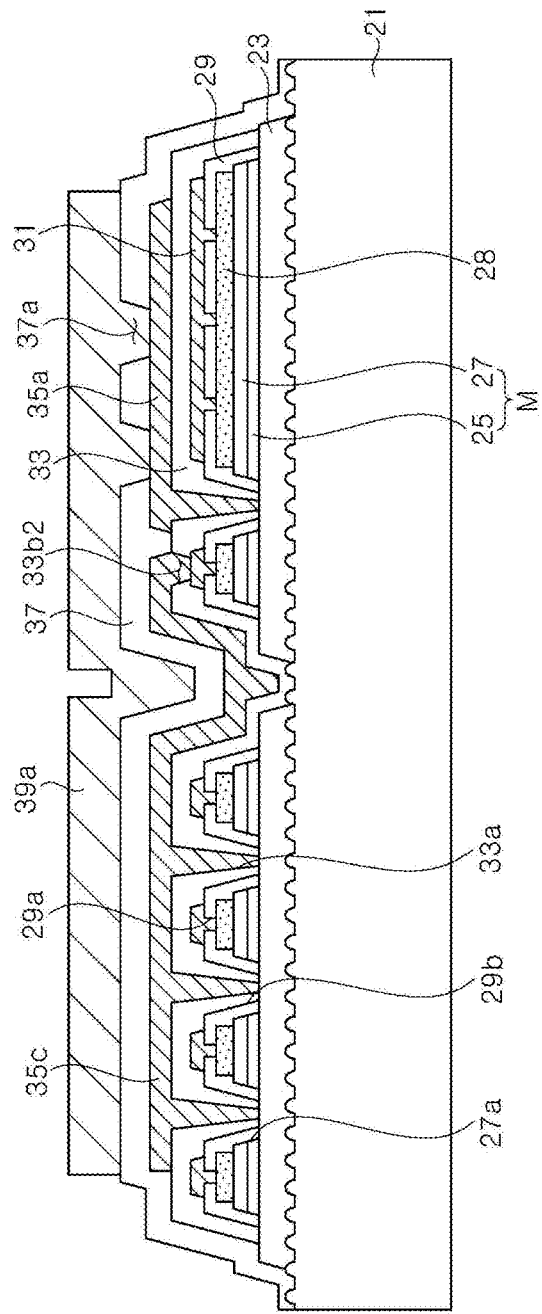
FIG. 13 is a schematic cross-sectional view taken along line B-B of FIG. 11.
Figure 14:
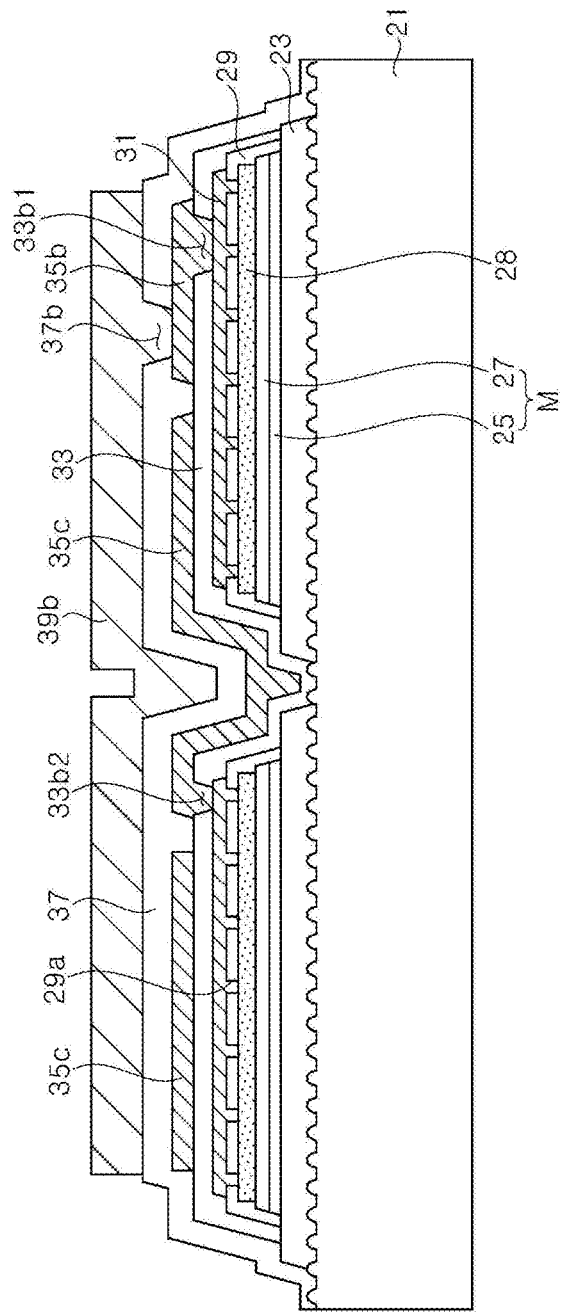
FIG. 14 is a schematic cross-sectional view taken along line C-C of FIG. 11.

FIG. 11 is a schematic plan view illustrating a light emitting diode according to another exemplary embodiment, FIG. 12 is a schematic circuit diagram illustrating the light emitting diode of FIG. 11, FIG. 13 is a schematic cross-sectional view taken along line B-B of FIG. 11, and FIG. 14 is a schematic cross-sectional view taken along line C-C of FIG. 11.

Referring to FIGS. 11 through 14, the light emitting diode according to the illustrated exemplary embodiment is substantially similar to those described with above embodiments except that a plurality of light emitting cells C1, C2, C3, and C4 is arranged on a substrate 21. The light emitting cells C1, C2, C3, and C4 may be connected in series between a first bump pad 39a and a second bump pad 39b as shown in FIG. 12.

The first through the fourth light emitting cells C1, C2, C3, and C4 are disposed on the substrate 21. The first through the fourth light emitting cells C1, C2, C3, and C4 are spaced apart from one another by an isolation region exposing the substrate 21. An upper surface of the substrate 21 may be exposed in a region between the light emitting cells.

In the illustrated exemplary embodiment, the first and second light emitting cells C1 and C2 are shown as being disposed below, and the third and fourth light emitting cells C3 and C4 are shown as being disposed above, but the first through the fourth light emitting cells C1, C2, C3, and C4 may be arranged in various ways. Further, in the illustrated exemplary embodiment, although the four light emitting cells are shown and described as being arranged on the substrate 21, a number of light emitting cells is not particularly limited. For example, two light emitting cells may be disposed on the substrate 21, or seven light emitting cells may be disposed on the substrate 21.

Each of the light emitting cells includes a first conductivity type semiconductor layer 23 and a mesa M. Since the first conductivity type semiconductor layer 23 and the mesa M are identical to those described above with reference to FIGS. 1 and 2, detailed descriptions of the same elements will be omitted to avoid redundancy.

The mesa M may be located within a region surrounded by the first conductivity type semiconductor layer 23, and thus, regions near edges of the first conductivity type semiconductor layer 23 adjacent to outer side surfaces of the first conductivity type semiconductor layer 23 are not covered by the mesa M and exposed to the outside.

In the illustrated exemplary embodiment, each mesa M may include vias 27a, and the first conductivity type semiconductor layer 23 is exposed in the vias 27a.

Meanwhile, a conductive oxide layer 28 is disposed on each mesa M, and dielectric layers 29 cover the conductive oxide layer 28 and the mesa M on the light emitting cells C1, C2, C3, and C4, respectively. The conductive oxide layer 28 is in ohmic contact with a second conductivity type semiconductor layer 27. The conductive oxide layer 28 may be disposed over almost an entire region of the mesa M in an upper region of the mesa M. However, the conductive oxide layer 28 may be spaced apart from an edge of the mesa M.

The dielectric layer 29 may cover the upper region and side surfaces of the mesa M, and may cover the first conductivity type semiconductor layer exposed around the mesa M. The dielectric layer 29 also has openings 29a exposing the conductive oxide layer 28. The dielectric layer 29 may be located in an upper region of the first conductivity type semiconductor layer 23, and thus, the dielectric layers 29 on different light emitting cells may be spaced apart from one another. However, the inventive concepts are not necessarily limited thereto, and dielectric layers on adjacent light emitting cells may be connected to one another.

A metal reflection layer 31 is disposed on the dielectric layer 29 and connected to the conductive oxide layer 28 through the openings 29a of the dielectric layer 29. The metal reflection layer 31 is disposed in the upper region of the mesa M of each of the light emitting cells C1, C2, C3, and C4.

A lower insulation layer 33 covers the mesas M and covers the metal reflection layer 31 and the dielectric layer 29. The lower insulation layer 33 also covers the first conductivity type semiconductor layer 23 and the substrate 21 exposed to the outside of the dielectric layer 29. When the substrate 21 is a patterned sapphire substrate, the lower insulation layer 33 may be formed along shapes of protrusions on the substrate 21.

As illustrated, an edge of the lower insulation layer 33 may be located on the first conductivity type semiconductor layer 23 of each of the light emitting cells, but the inventive concepts are not limited thereto and may be located on the substrate 21 while covering a side surface of the first conductivity type semiconductor layer 23.

The lower insulation layer 33 has first openings 33a exposing the first conductivity type semiconductor layer 23 in vias 27a of each mesa M, and also has a second opening 33b1 exposing the metal reflection layer 31 on the first light emitting cell C1 and second openings 33b2 exposing the metal reflection layers 31 on the second, third, and third light emitting cells C2, C3, and C4.

In the illustrated exemplary embodiment, the lower insulation layer 33 does not include an opening exposing the first conductivity type semiconductor layer 23 around the mesa M. However, the inventive concepts are not limited thereto, and the lower insulation layer 33 may include the opening exposing the first conductivity type semiconductor layer 23 around the mesa.

The second openings 33b1 are disposed on the first light emitting cells C1, and the second openings 33b1 expose the metal reflection layers 31 of each of the light emitting cells near an isolation region of the light emitting cells. The second openings 33b1 may generally have an elongated shape along the isolation region, but the inventive concepts are not limited thereto and may have various shapes.

Meanwhile, the second opening 33b1 may be located on the first light emitting cell C1, and may be located within a lower region of the second bump pad 39b. However, in another exemplary embodiment, the second opening 33b1 may be disposed apart from the second bump pad 39b on the first light emitting cell C1 in a lateral direction.

Meanwhile, a first pad metal layer 35a, a second pad metal layer 35b, and a connection metal layer 35c are disposed on the lower insulation layer 33.

The first pad metal layer 35a is disposed on the fourth light emitting cell C4, and is in ohmic contact with the first conductivity type semiconductor layer 23 exposed in the vias 27a of the mesa M. In the illustrated exemplary embodiment, although internal contacts are shown as being formed in the vias 27a, external contacts may be formed around the mesa M. However, by disposing the first pad metal layer 35a in the upper region of the mesa M, the first pad metal layer 35a may be spaced far apart from an edge of the substrate 21, and thus, it is possible to prevent the first pad metal layer 35a from being damaged by moisture permeation from a side surface of the substrate 21.

The second pad metal layer 35b may be disposed on the first light emitting cell C1, and may be electrically connected to the metal reflection layer 31 through the second opening 33b1. Accordingly, the second pad metal layer 35b is electrically connected to the second conductivity type semiconductor layer 27 of the first light emitting cell C1.

The second pad metal layer 35b is located on the mesa M and insulated from the first conductivity type semiconductor layer 23. Furthermore, the second pad metal layer 35b may be spaced apart from the side surfaces of the mesa M on the first light emitting cell C1. As such, it is possible to prevent the second pad metal layer 35b from being damaged by moisture permeation from the side surface of the substrate 21.

Meanwhile, the connection metal layers 35c connect adjacent light emitting cells in series with one another. The connection metal layers 35c may be electrically connected to the first conductivity type semiconductor layer 23 and the second conductivity type semiconductor layer 27 of the adjacent light emitting cells through the first opening 33a and the second opening 33b2 of the lower insulation layer 33. For example, one connection metal layer 35c may be electrically connected to the first conductivity type semiconductor layer 23 in the first light emitting cell C1, and may also be electrically connected to the metal reflection layer 31 on the second light emitting cell C2. Accordingly, the first light emitting cell C1 and the second light emitting cell C2 are connected in series with each other through the connection metal layer 33c. As such, the second light emitting cell C2 and the third light emitting cell C3 may be connected in series through the connection metal layer 35c, and the third light emitting cell C3 and the fourth light emitting cell C4 may be connected in series through the connection metal layer 35c, as shown in FIG. 11.

The connection metal layers 35c are spaced apart from the first pad metal layer 35a and the second pad metal layer 35b. Furthermore, the connection metal layers 35c may be formed to have a narrower width than that of the mesa M, and thus, may be spaced apart from the edge of the substrate 21 farther than the mesa M.

In some forms, the first and second pad metal layers 35a and 35b and the connection metal layers 35c may be formed together using the same material through the same process. For example, the first and second pad metal layers 35a and 35b and the connection metal layers 35c may include an ohmic reflection layer such as an Al layer, and the ohmic reflection layer may be formed on an adhesive layer such as Ti, Cr, Ni, or the like. In addition, a protection layer having a single layer or a composite layer structure of Ni, Cr, Au, or the like may be formed on the ohmic reflection layer. The first and second pad metal layers 35a and 35b and the connection metal layers 35c may have, for example, a multi-layered structure of Cr/Al/Ni/Ti/Ni/Ti/Au/Ti.

An upper insulation layer 37 is disposed on the first pad metal layer 35a, the second pad metal layer 35b, and the connection metal layers 35c, and has a first opening 37a exposing the first pad metal layer 35a and a second opening 37b exposing the second pad metal layer 35b. The upper insulation layer 37 may cover the upper surface of the substrate 21 exposed around the light emitting cells. The upper insulation layer 37 may cover the edge of the substrate 21 as illustrated, but the inventive concepts are not limited thereto, and an edge of the upper insulation layer 37 may be located inside the edge of the substrate 21.

Meanwhile, the first opening 37a is disposed in an upper region of the first pad metal layer 35a, and thus, is spaced apart from the connection metal layer 35c and the second opening 33b2 of the lower insulation layer 33. In addition, the second opening 37b is also limitedly located on the second pad metal layer 35b and spaced apart from the connection metal layer 35c.

In the illustrated exemplary embodiment, the first and second pad metal layers 35a and 35b exposed through the first and second openings 37a and 37b of the upper insulation layer 37 may be used as a bonding pad to which solder is directly bonded. Alternatively, as described with reference to FIGS. 1 and 2, the first and second bump pads 39a and 39b may cover the first and second pad metal layers 35a and 35b exposed through the first and second openings 37a and 37b of the upper insulation layer 37, respectively. The first and second bump pads 39a and 39b may be disposed over a plurality of light emitting cells, respectively, and may cover the first and second openings 37a and 37b and seal them.

In the illustrated exemplary embodiment, the lower insulation layer 33 may be the lower insulation layer described with reference to FIG. 3, but the inventive concepts are not limited thereto and may be the lower insulation layer 33' described with reference to FIG. 6. In addition, it may be the lower insulation layer described with reference to FIG. 9A or 9B. Furthermore, the lower insulation layer 33 may be a lower insulation layer including a conventional distributed Bragg reflector, and in this case, the upper insulation layer 37 may include a $SiO_2$—$TiO_2$ mixed layer or an $MgF_2$ layer.

Meanwhile, a reliability test was carried out by applying a capping layer 33d formed of a $SiO_2$—$TiO_2$ mixed layer and a lower insulation layer 33' to which the distributed Bragg reflector of FIG. 7 is applied to a light emitting diode including a plurality of light emitting cells under a high temperature and high humidity environment at a temperature of 85° C. and a relative humidity of 85% and at a temperature of 60° C. and a relative humidity of 90%. Meanwhile, a reliability test was carried out by applying the lower insulation layer according to the dotted line of FIG. 5 to the light emitting diode including the plurality of light emitting cells under the same conditions.

The reliability test with samples according to the prior art was stopped as most of the light emitting diodes failed after 500 hours, but a failure rate with samples according to the exemplary embodiment of the present disclosure did not exceed 5% until 2,000 hours under both conditions.

Therefore, it was confirmed that reliability was improved in the high temperature and high humidity environment by using the $SiO_2$—$TiO_2$ mixed layer.

Figure 15:
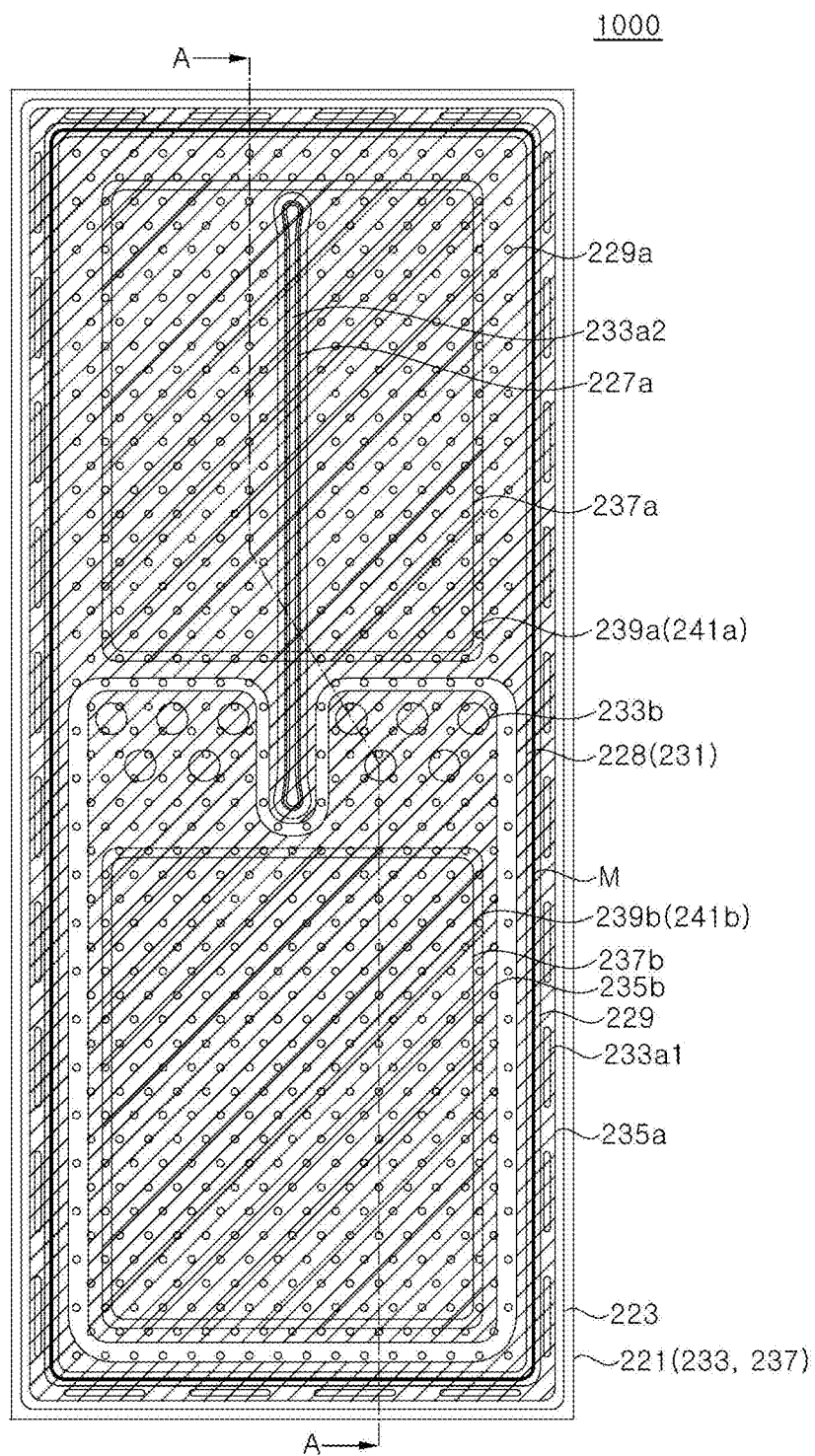
FIG. 15 is a schematic plan view illustrating a light emitting diode according to an exemplary embodiment.
Figure 16:
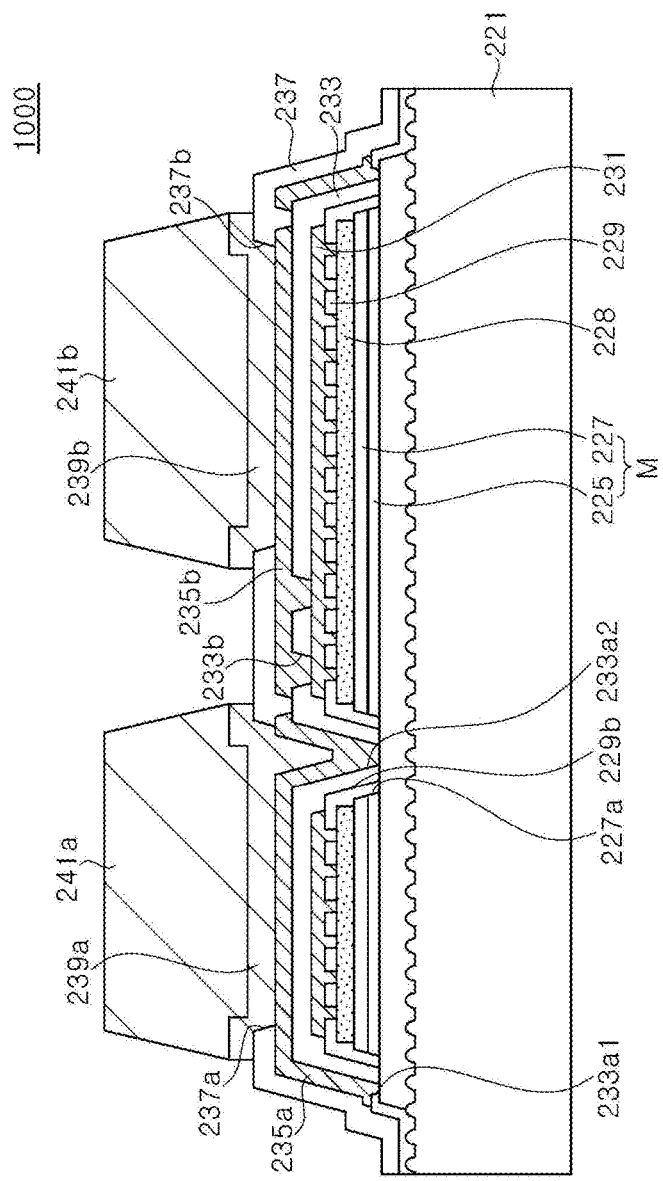
FIG. 16 is a cross-sectional view taken along line A-A of FIG. 15.

FIG. 15 is a schematic plan view illustrating a light emitting diode 1000 according to an exemplary embodiment, and FIG. 16 is a cross-sectional view taken along line A-A of FIG. 15.

Referring to FIGS. 15 and 16, the light emitting diode may include a substrate 221, a first conductivity type semiconductor layer 223, an active layer 225, a second conductivity type semiconductor layer 227, and a conductive oxide layer 228, a dielectric layer 229, a metal reflection layer 231, a lower insulation layer 233, a first pad metal layer 235a, a second pad metal layer 235b, an upper insulation layer 237, a first bump pad 239a, a second bump pad 239b, a first solder bump 241a, and a second solder bump 241b.

The substrate 221 is not particularly limited as long as it is a substrate capable of growing a gallium nitride-based semiconductor layer. Examples of the substrate 221 may be various such as a sapphire substrate, a gallium nitride substrate, a SiC substrate, and may be a patterned sapphire substrate. The substrate 221 may have a rectangular or square shape as seen in plan view, but the inventive concepts are not necessarily limited thereto. A size of the substrate 221 is not particularly limited and may be selected in various ways.

The first conductivity type semiconductor layer 223 is disposed on the substrate 221. The first conductivity type semiconductor layer 223 is a layer grown on the substrate 221 and may be a gallium nitride-based semiconductor layer. The first conductivity type semiconductor layer 223 may be a gallium nitride-based semiconductor layer doped with an impurity, for example, Si.

In the illustrated exemplary embodiment, an edge of the first conductivity type semiconductor layer 223 is located inside a region surrounded by an edge of the substrate 221. Accordingly, a portion of an upper surface of the substrate 221 may be exposed along a periphery of the first conductivity type semiconductor layer 223. However, the inventive concepts are not limited thereto, and the edge of the first conductivity type semiconductor layer 223 may be in flush with the edge of the substrate 221.

A mesa M may be disposed on the first conductivity type semiconductor layer 223. The mesa M may be located within a region surrounded by the first conductivity type semiconductor layer 223, and thus, regions near the edge of the first conductivity type semiconductor layer 223 may not be covered by the mesa M but may be exposed to the outside.

The mesa M includes the second conductivity type semiconductor layer 227 and the active layer 225. Although not shown in the drawings, the mesa M may include a partial thickness of the first conductivity type semiconductor layer 223. The active layer 225 is interposed between the first conductivity type semiconductor layer 223 and the second conductivity type semiconductor layer 227. The active layer 225 may have a single quantum well structure or a multiple quantum well structure. A composition and a thickness of the well layer within the active layer 225 determines a wavelength of light generated. In particular, it is possible to provide an active layer that generates ultraviolet light, blue light or green light by controlling the composition of the well layer.

Meanwhile, the second conductivity type semiconductor layer 227 may be a gallium nitride-based semiconductor layer doped with a p-type impurity, for example, Mg. A concentration of the p-type impurity in the second conductivity type semiconductor layer 227 may have a concentration profile that varies with a thickness within the above range.

Meanwhile, each of the first conductivity type semiconductor layer 223 and the second conductivity type semiconductor layer 227 may be a single layer, but the inventive concepts are not limited thereto, and may be a multilayer, and may include a superlattice layer. The first conductivity type semiconductor layer 223, the active layer 225, and the second conductivity type semiconductor layer 227 may be formed by growing on the substrate 221 in a chamber using a known method such as metal organic chemical vapor deposition (MOCVD) process or a molecular beam epitaxy (MBE) process.

Meanwhile, in the mesa M, as shown in FIG. 15, a via hole 227a exposing the first conductivity type semiconductor layer 223 may be included. The via hole 227a may be surrounded by the second conductivity type semiconductor layer 227 and the active layer 225. The via hole 227a may have an elongated shape passing through a center of the light emitting diode as shown in FIG. 15. As shown in FIGS. 15-16, the via hole 227a may pass through a center of the mesa M, and may be biased toward one edge of the mesa M. A length of the via hole 227a is not particularly limited, and may be ½ or longer than a length of the mesa M.

Meanwhile, as shown in FIGS. 15-16, both end portions of the via hole 227a may have a relatively wide width and a round shape. The dielectric layer 229 and the lower insulation layer 233 may be patterned in a similar shape by making the shape of the end portion of the via holes 227a in this manner. In particular, in a case that the lower insulation layer 233 includes a distributed Bragg reflector, when the width of the via hole is not widened at the end portion of the via hole 227a as shown in FIG. 15, a severe double step is formed on a sidewall of the distributed Bragg reflector, and cracks are likely to occur in the first pad metal layer 235a since an inclination angle of the sidewall increases As such, the shape of the end portion of the via hole 227a and that of the end portion of the first opening 233a2 of the lower insulation layer 233 are made as in the illustrated exemplary embodiment, and thus, an edge of the lower insulation layer 233 is formed to have a gentle inclination angle, thereby improving a yield of the light emitting diode.

Although it has been illustrated and described that the mesa M has a single via hole 227a, but the inventive concepts are not limited thereto. For example, a plurality of via holes may be arranged in the mesa M. As the number of via holes 227a increases, current dissipation performance of the light emitting diode may be improved. In addition, instead of the via hole 227a, an indentation penetrating into the mesa M may be formed around the mesa M. The indentation may be formed lengthily inside the mesa M from one edge of the mesa M toward another edge opposite to the one edge.

Meanwhile, the conductive oxide layer 228 is disposed over the mesa M to contact the second conductivity type semiconductor layer 227. The conductive oxide layer 228 may be disposed over almost an entire region of the mesa M in an upper region of the mesa M. For example, the conductive oxide layer 228 may cover 80% or more of the upper region of the mesa M, and further 90% or more.

The conductive oxide layer 228 is formed of an oxide layer that transmits light generated in the active layer 225. The conductive oxide layer 228 may be formed of, for example, indium tin oxide (ITO), ZnO, or the like. The conductive oxide layer 228 is formed to have a thickness sufficient to make ohmic contact with the second conductivity type semiconductor layer 227, and for example, may be formed to have a thickness within a thickness range of about 3 nm to about 50 nm, specifically, within a thickness range of about 6 nm to about 30 nm. When the thickness of the conductive oxide layer 228 is too thin, a sufficient ohmic characteristic cannot be provided, and a forward voltage increases. In addition, when the thickness of the conductive oxide layer 228 is too thick, loss due to light absorption occurs, thereby reducing luminous efficiency.

Meanwhile, the dielectric layer 229 covers the conductive oxide layer 228. Furthermore, the dielectric layer 229 may cover side surfaces of the second conductivity type semiconductor layer 227 and the active layer 225. An edge of the dielectric layer 229 may be covered with the lower insulation layer 233. Accordingly, the edge of the dielectric layer 229 is located farther from the edge of the substrate 221 compared to the edge of the lower insulation layer 233. Accordingly, as it will be described later, a portion of the lower insulation layer 233 may be in contact with the first conductivity type semiconductor layer 223 around the mesa M. Furthermore, the dielectric layer 229 may be defined in an upper region of the second conductivity type semiconductor layer 227, and the lower insulation layer 233 may be in contact with the side surfaces of the second conductivity type semiconductor layer 227 and the active layer 225.

The dielectric layer 229 has openings 229a exposing the conductive oxide layer 228. A plurality of openings 229a may be disposed over the conductive oxide layer 228. The openings 229a are used as connection passages so that the metal reflection layer 231 can be connected to the conductive oxide layer 228. The dielectric layer 229 may also have an opening 229b exposing the first conductivity type semiconductor layer 223 around the mesa M and exposing the first conductivity type semiconductor layer 223 in the via hole 227a.

The dielectric layer 229 is formed of an insulating material having a lower index of refraction than those of the second conductivity type semiconductor layer 227 and the conductive oxide layer 228. The dielectric layer 229 may be formed of, for example, $SiO_2$.

The dielectric layer 229 may have a thickness within a range of about 200 nm to about 1000 nm, and specifically, may have a thickness within a range of about 300 nm to about 800 nm. When the thickness of the dielectric layer 229 is less than 200 nm, a forward voltage is high and a light output is low, which is not favorable. Meanwhile, when the thickness of the dielectric layer 229 exceeds 400 nm, light output is saturated, and the forward voltage tends to increase again. As such, it is advantageous that the thickness of the dielectric layer 229 does not exceed 1000 nm, and in particular, may be 800 nm or less.

The metal reflection layer 231 is disposed on the dielectric layer 229 to connect to the ohmic contact layer 228 through the openings 229a. The metal reflection layer 231 may include a reflective metal, and for example, may include Ag or Ni/Ag. Furthermore, the metal reflection layer 232 may include a barrier layer for protecting the reflective metal material layer, for example, Ni, and may include an Au layer to prevent oxidation of the metal layer. Furthermore, so as to improve adhesion of the Au layer, a Ti layer may be included under the Au layer. The metal reflection layer 231 is in contact with an upper surface of the dielectric layer 229, and thus, the thickness of the dielectric layer 229 is equal to a separation distance between the conductive oxide layer 228 and the metal reflection layer 231.

As the ohmic contact is formed with the conductive oxide layer 228, and the metal reflection layer 231 is disposed on the dielectric layer 229, it is possible to prevent an increase in ohmic resistance due to solder or the like. Further, since the conductive oxide layer 228, the dielectric layer 229, and the metal reflection layer 231 are disposed on the second conductivity type semiconductor layer 227, a reflectance of light may be improved, thereby improving luminous efficiency.

The lower insulation layer 233 covers the mesa M and the metal reflection layer 231. The lower insulation layer 233 may also cover the first conductivity type semiconductor layer 223 along a periphery of the mesa M, and may cover the first conductivity type semiconductor layer 223 in the via hole 227a inside the mesa M. The lower insulation layer 233 covers a side surface of the mesa M, in particular. The lower insulation layer 233 may also cover the dielectric layer 229.

The lower insulation layer 233 has a first set of openings 233a1 and 233a2 exposing the first conductivity type semiconductor layer 223 and a second opening 233b exposing the metal reflection layer 231. In the first set of openings, the openings 233a1 exposes the first conductivity type semiconductor layer 223 along the periphery of the mesa M, and the openings 233a2 expose the first conductivity type semiconductor layer 223 in the via hole 227a.

As shown in FIG. 15, a plurality of the openings 233a1 may be arranged along the periphery of the mesa M, but the inventive concepts are not limited thereto. For example, a single first opening 233a1 may be formed along the periphery of the mesa M.

In the illustrated exemplary embodiment, although the openings 233a1 of the lower insulation layer 233 have been illustrated and described as being disposed along the periphery of the mesa M, the lower insulation layer 233 may be formed to expose all of a peripheral region of the first conductivity type semiconductor 223 including an edge of the first conductivity type semiconductor 223. That is, in the illustrated exemplary embodiment, the edge of the lower insulation layer 233 has been illustrated as being in flush with the edge of the substrate 221, but the edge of the lower insulation layer 233 may be located on the first conductivity type semiconductor layer 223.

The second opening 233b exposes the metal reflection layer 231. A plurality of second openings 233b may be formed, and these second openings 233b may be disposed near a central region of the mesa M.

Meanwhile, the lower insulation layer 233 may be formed of a single layer of $SiO_2$ or $Si_3N_4$, but the inventive concepts are not limited thereto and may be formed of multiple layers. Furthermore, the lower insulation layer 233 may include a distributed Bragg reflector. The distributed Bragg reflector may be formed by stacking insulation layers having different indices of refraction from one another. For example, the distributed Bragg reflector may be formed by alternately stacking a silicon oxide layer and a titanium oxide layer one above another. The lower insulation layer 233 may also include a capping layer. The capping layer may function as a protection layer covering an upper surface of the distributed Bragg reflector to protect the distributed Bragg reflector. The capping layer also improves adhesion of the pad metal layers 235a and 235b disposed on the distributed Bragg reflector. The capping layer may be formed of $SiO_2$, but the inventive concepts are not limited thereto and may be formed of a $SiO_2$—$TiO_2$ mixed layer or an $MgF_2$ layer. Since the $SiO_2$—$TiO_2$ mixed layer or the MgF2 layer has a waterproof characteristic, reliability of the light emitting diode is improved in a high temperature and high humidity environment.

The first pad metal layer 235a is disposed on the lower insulation layer 233, and insulated from the mesa M and the metal reflection layer 231 by the lower insulation layer 233. The first pad metal layer 235a contacts the first conductivity type semiconductor layer 223 through the first openings 233a1 and 233a2 of the lower insulation layer 233. The first pad metal layer 235a may contact the first conductivity type semiconductor layer 223 through the first openings 233a1 along the periphery of the mesa M, and may also contact the first conductivity type semiconductor layer 223 in the via hole 227a through the second opening 233a2.

Meanwhile, the second pad metal layer 235b is disposed over the upper region of the mesa M on the lower insulation layer 233, and electrically connected to the metal reflection layer 231 through the second opening 233b of the lower insulation layer 233. The second pad metal layer 235b may be surrounded by the first pad metal layer 235a, and a boundary region may be formed therebetween. As shown in FIG. 15, the boundary region may be formed in a ring shape. The lower insulation layer 233 is exposed in the boundary region, and the boundary region is covered with an upper insulation layer 237 which will be described later.

In some forms, the first pad metal layer 235a and the second pad metal layer 235b may be formed together using the same material through the same process. The first and second pad metal layers 235a and 235b may include an ohmic reflection layer such as an Al layer, and the ohmic reflection layer may be formed on an adhesive layer such as Ti, Cr, Ni, or the like. In addition, a protection layer having a single layer or a composite layer structure of Ni, Cr, Au, or the like may be formed on the ohmic reflection layer. The first and second pad metal layers 235a and 235b may have, for example, a multi-layered structure of Cr/Al/Ni/Ti/Ni/Ti/Au/Ti.

The upper insulation layer 237 covers the first and second pad metal layers 235a and 235b. In addition, the upper insulation layer 237 may cover the first conductivity type semiconductor layer 223 along the periphery of the mesa M. In the illustrated exemplary embodiment, the upper insulation layer 237 is in flush with the edge of the substrate 221. However, the inventive concepts are not limited thereto, and an edge of the upper insulation layer 237 may be located inside a region surrounded by the edge of the substrate 221 so that the upper insulation layer 237 exposes an edge region of the substrate 221.

The upper insulation layer 237 has a first opening 237a exposing the first pad metal layer 235a and a second opening 237b exposing the second pad metal layer 235b. The first opening 237a and the second opening 237b may be disposed in the upper region of the mesa M, and may be disposed to face each other. In particular, the first opening 237a and the second opening 237b may be disposed adjacent to both edges of the mesa M. Also, as illustrated, the second opening 237b of the upper insulation layer 237 may be laterally spaced apart from the second opening 233b of the lower insulation layer 233. Since the second opening 233b of the lower insulation layer 233 and the second opening 237b of the upper insulation layer 237 are laterally spaced apart, it is possible to prevent the metal reflective layer 231 and the conductive oxide layer 228 from being damaged by a solder.

The upper insulation layer 237 may be formed of a single layer of $SiO_2$ or $Si_3N_4$, but the inventive concepts are not limited thereto and may include a $SiO_2$—$TiO_2$ mixed layer or an $MgF_2$ layer. As the $SiO_2$—$TiO_2$ mixed layer or the $MgF_2$ layer has a favorable waterproof characteristic, reliability of the light emitting diode may be improved in a high temperature and high humidity environment. In addition, the upper insulation layer 237 may have a multi-layered structure including a silicon nitride layer and a silicon oxide layer, or may include a distributed Bragg reflector in which a silicon oxide layer and a titanium oxide layer are alternately stacked one above another.

Meanwhile, the first bump pad 239a electrically contacts the first pad metal layer 235a exposed through the first opening 237a of the upper insulation layer 237, and the second bump pad 239b electrically contacts the second pad metal layer 235b exposed through the second opening 237b. As shown in FIG. 15, the first bump pad 239a and the second bump pad 239b cover all of the first opening 237a and the second opening 237b of the upper insulation layer 237 and seal them, respectively. However, the inventive concepts are not limited thereto, and the first bump pad 239a may be disposed in the first opening 237a of the upper insulation layer 237 and the second bump pad 239b may be disposed in the second opening 237b of the upper insulation layer 237.

Moreover, as shown in FIG. 15, the second bump pad 239b may be located within an upper region of the second pad metal layer 235a. However, the inventive concepts are not limited thereto, and a portion of the second bump pad 239b may be overlapped with the first pad metal layer 235a. However, the upper insulation layer 237 may be disposed between the first pad metal layer 235a and the second bump pad 239b and insulate them.

The first and second bump pads 239a and 239b may be formed of a metal layer, and may include a plurality of layers. In particular, the first and second bump pads 239a and 239b may include Au or Pt.

The first solder bump 241a is disposed on the first bump pads 239a, and the second solder bump 241b is disposed on the second bump pads 239b. The first and second solder bumps 241a and 241b may include, for example, AgCuSn.

The first and second solder bumps 241a and 241b are formed by removing flux using a reflow process after disposing a solder paste including solder powder and flux on the first and second bump pads 239a and 239b, respectively. Accordingly, the first and second solder bumps 241a and 241b may have same bottom areas as those of the first bump pads 239a and 239b, respectively.

Meanwhile, the first and second solder bumps 241a and 241b are relatively thicker than the first and second bump pads 239a and 239b. For example, a thickness T2 of the first or second solder bumps 241a or 241b may be 10 to 80 times of a thickness T1 of the first or second bump pads 239a or 239b. By way of example only, the first and second bump pads 239a and 239b may have a thickness of about 1 µm, whereas the first and second solder bumps 241a and 241b may have a thickness of about 10 µm to about 100 µm.

Figure 17:
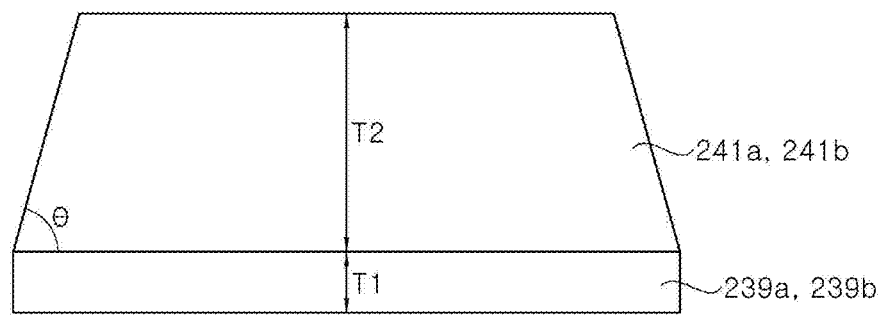
FIG. 17 is a schematic cross-sectional view illustrating a solder bump of a light emitting diode according to an exemplary embodiment.

In addition, the first and second solder bumps 241a and 241b may have an inclined side surface, and may have a substantially trapezoidal cross-sectional shape. As shown in FIG. 17, an inclination angle $\theta$ of side surfaces of the first and second solder bumps 241a and 241b with respect to a bottom surface thereof may be in a range of about 65 degrees to about 75 degrees. When the inclination angle $\theta$ is within the above range, the solder bumps 241a and 241b may be easily formed, and further, the light emitting diode 1000 may be easily transferred.

Figure 18:
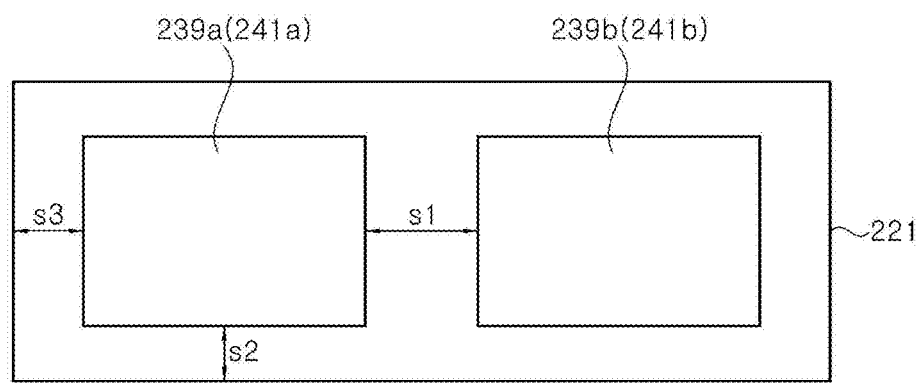
FIG. 18 is a schematic plan view illustrating a light emitting diode according to an exemplary embodiment.

Meanwhile, as shown in FIG. 18, an interval s1 between the first solder bump 241a and the second solder bump 241b, intervals s2 and s3 between the first and second solder bumps 241a and 241b and the edge of the substrate 221 need to be controlled. For example, the interval s1 is twice or more of thicknesses of the first and second solder bumps 241a and 241b. An upper limit of the interval s1 is not particularly limited, but the upper limit of the interval s1 may not exceed 10 times to secure sufficient areas of the solder bumps 241a and 241b.

Meanwhile, the intervals s2 and s3 may be ½ or more of the interval s1. Further, the intervals s2 and s3 may be equal to or greater than the thickness T2 of the first and second solder bumps 241a and 241b. By controlling the intervals s1, s2, and s3, the first and second solder bumps 241a and 241b may be easily formed using screen printing technology, and an electrical short circuit between the solder bumps may be prevented.

According to an exemplary embodiment of the present disclosure, a reflection structure of the conductive oxide layer 228, the dielectric layer 229, and the metal reflection layer 231 is used instead of a conventional ohmic reflection layer. Accordingly, it is possible to block intrusion of a bonding material such as solder into a contact region, and to secure a stable ohmic contact resistance, thereby improving the reliability of the light emitting diode. Furthermore, by making the dielectric layer 229 thicker than 300 nm, a high light output and a low forward voltage may be achieved.

Furthermore, as the first and second solder bumps 241a and 241b are formed on the first and second bump pads 239a and 239b, an amount of solder paste used in a mounting process of the light emitting diode may be reduced and the mounting process of the light emitting diode may be simplified.

In addition, as the solder bumps 241a and 241b having the thickness of 10 times or greater than those of the first and second bump pads 239a and 239b are arranged, it is possible to easily handle the light emitting diode.

FIGS. 19A through 19F are schematic cross-sectional views illustrating a manufacturing process of a light emitting device according to an exemplary embodiment. Herein, a process of forming solder bumps 241a and 241b using screen printing technology and mounting them on a mounting surface using the same will be described.

Figure 19A:
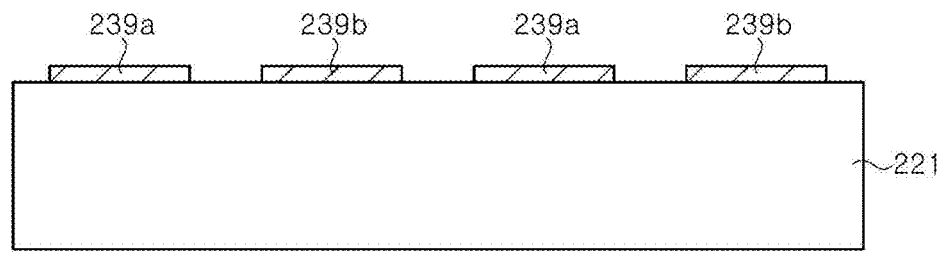
FIGS. 19A through 19F are schematic cross-sectional view illustrating a manufacturing process of a light emitting device according to an exemplary embodiment, where.

First, referring to FIG. 19A, a substrate 221 on which bump pads 239a and 239b are formed is prepared. Although not shown in FIG. 19A, a first conductivity type semiconductor layer 223, an active layer 225, a second conductivity type semiconductor layer 227, and a conductive oxide layer 228, a dielectric layer 229, a metal reflection layer 231, a lower insulation layer 233, a first pad metal layer 235a, a second pad metal layer 235b, and an upper insulation layer 237 as those described with reference to FIGS. 15 and 16 may be formed on the substrate 221. The first and second bump pads 239a and 239b may be disposed on the upper insulation layer 237.

A plurality of light emitting diode regions may be disposed on the substrate 221, and the first and second bump pads 239a and 239b may be formed in each region.

Figure 19B:
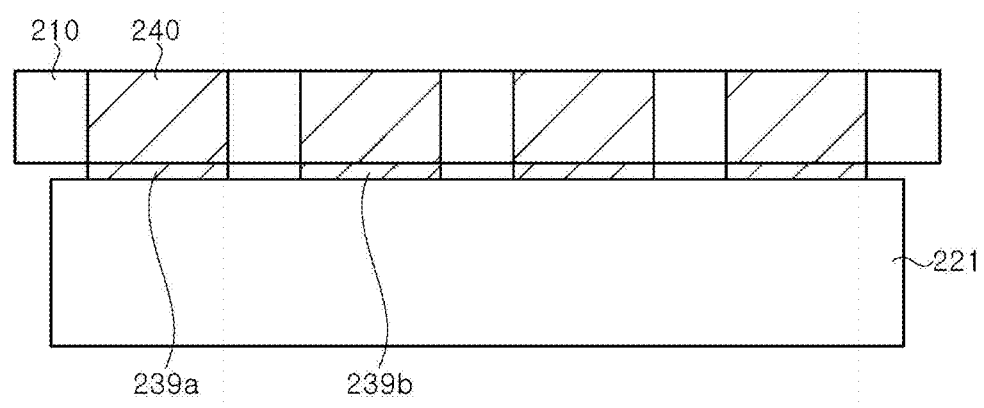

Referring to FIG. 19B, a mask 210 is disposed on the substrate 221. The mask 210 has openings exposing the bump pads 239a and 239b, and the mask 210 is disposed so that the openings are arranged on the bump pads 239a and 239b. Heights of the openings may be greater than or equal to about 20 μm, and the heights of the openings may be about 300 μm or less.

Subsequently, a solder paste 240 fills the openings of the mask 210. The solder paste 240 may be applied using, for example, a squeeze printing technique. Accordingly, the solder paste 240 having a thickness substantially corresponding to the heights of the openings is disposed on the bump pads.

Figure 19C:
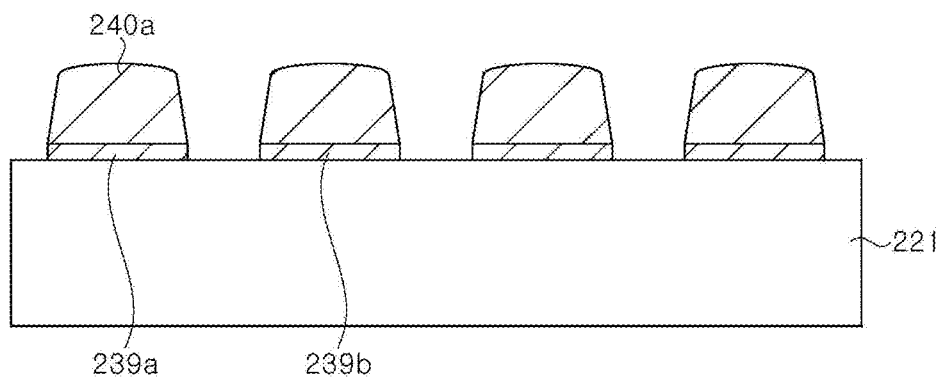

Referring to FIG. 19C, the mask 210 is removed, and the solder paste is reflowed through a reflow process. Accordingly, the solder paste is aggregated to form solder bumps 240a having an inclined side surface and a convex upper surface. Most of flux in the solder paste may be removed in the reflow process.

To remove the mask 210, an interval between the solder pastes 240 needs to be equal to or greater than the thickness of the solder paste 240. When the interval between the solder pastes 240 is too narrow, solder pastes 240 may be connected to one another, and thus, it is difficult to remove the mask 210.

Meanwhile, in the reflow process, the first and second bump pads 239a and 239b and solders may be diffused and mixed with one another. Accordingly, a boundary between the first and second bump pads 239a and 239b and the solder bump 240a may not be distinct. However, when the first and second bump pads 239a and 239b are formed of a multi-layered metal layer, some of them may be mixed with the solder and some of them may remain.

Figure 19D:
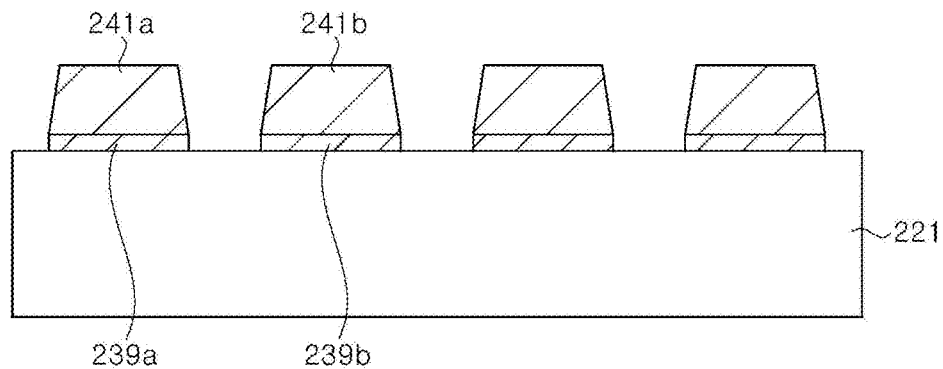

Referring to FIG. 19D, the first and second solder bumps 241a and 241b are formed by removing a portion of thicknesses of the solder bumps 240a. The solder bumps 240a may be cut using a cutting process, such as a flying cut technique, for example.

In particular, the solder bumps 240a may be cut by 50% or more. Accordingly, the first and second solder bumps 241a and 241b may be formed to have a thickness equal to or less than ½ of the height of the opening of the mask 210. In a case that the cutting of the solder bumps 240a is less than 50%, when the light emitting diodes are transferred, adhesion of the solder bumps 241a and 241b is not favorable, and thus, a process failure is likely to occur.

Figure 19E:
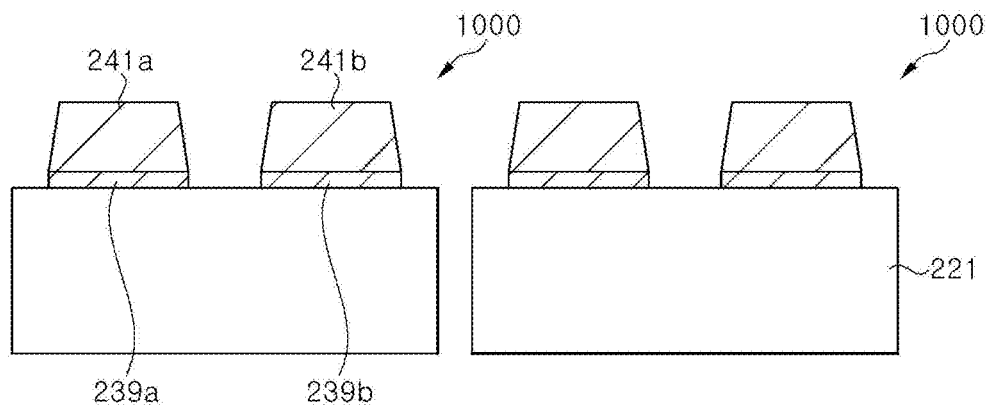

Referring to FIG. 19E, fabrication of individual light emitting diodes 1000 is completed by dividing the substrate 221. A process of reducing a thickness of the substrate by grinding a bottom surface of the substrate 221 before dividing the substrate 221 may be added. The process of reducing the thickness of the substrate 221 may be carried out before printing the solder paste.

Meanwhile, although it has been illustrated in FIGS. 19A through 19F that two light emitting diodes 1000 are formed, hundreds or thousands of light emitting diodes 1000 may be formed on one substrate 221.

Figure 19F:
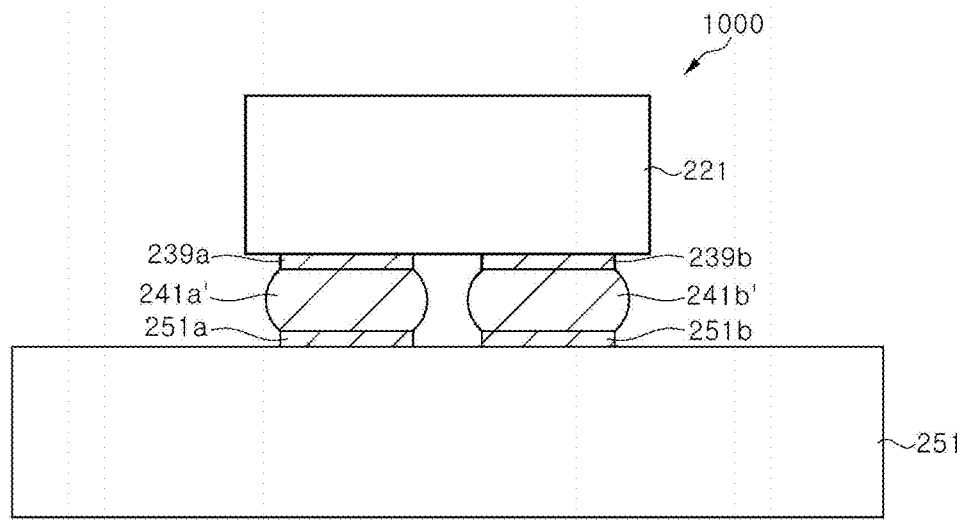

Referring to FIG. 19F, the light emitting diode 1000 is bonded on a sub-mount substrate 251 having connection pads 251a and 251b. The solder bumps 241a and 241b of the light emitting diode 1000 may be arranged on the connection pads 251a and 251b, and the light emitting diode 1000 may be bonded to the sub-mount substrate 251 by a bonding technique using a reflow process.

In this case, a solder paste may be applied in advance on the connection pads 251a and 251b. However, as the solder bumps 241a and 241b are disposed on the light emitting diode 1000, an amount of solder paste applied on the connection pads 251a and 251b may be significantly reduced compared.

As such, a light emitting device is provided by way of bonding the connection pads 251a and 251b and the first and second bump pads 241a and 241b with solders 241a' and 241b'.

Herein, although it has been described that the light emitting diode 1000 is mounted on the sub-mount substrate 251, a printed circuit board may be used instead of the sub-mount substrate 251, or a package having leads may be used.

Accordingly, various types of light emitting devices, such as a light emitting diode package on which the light emitting diode 1000 is mounted, or a light emitting module, may be provided.

Figure 20:
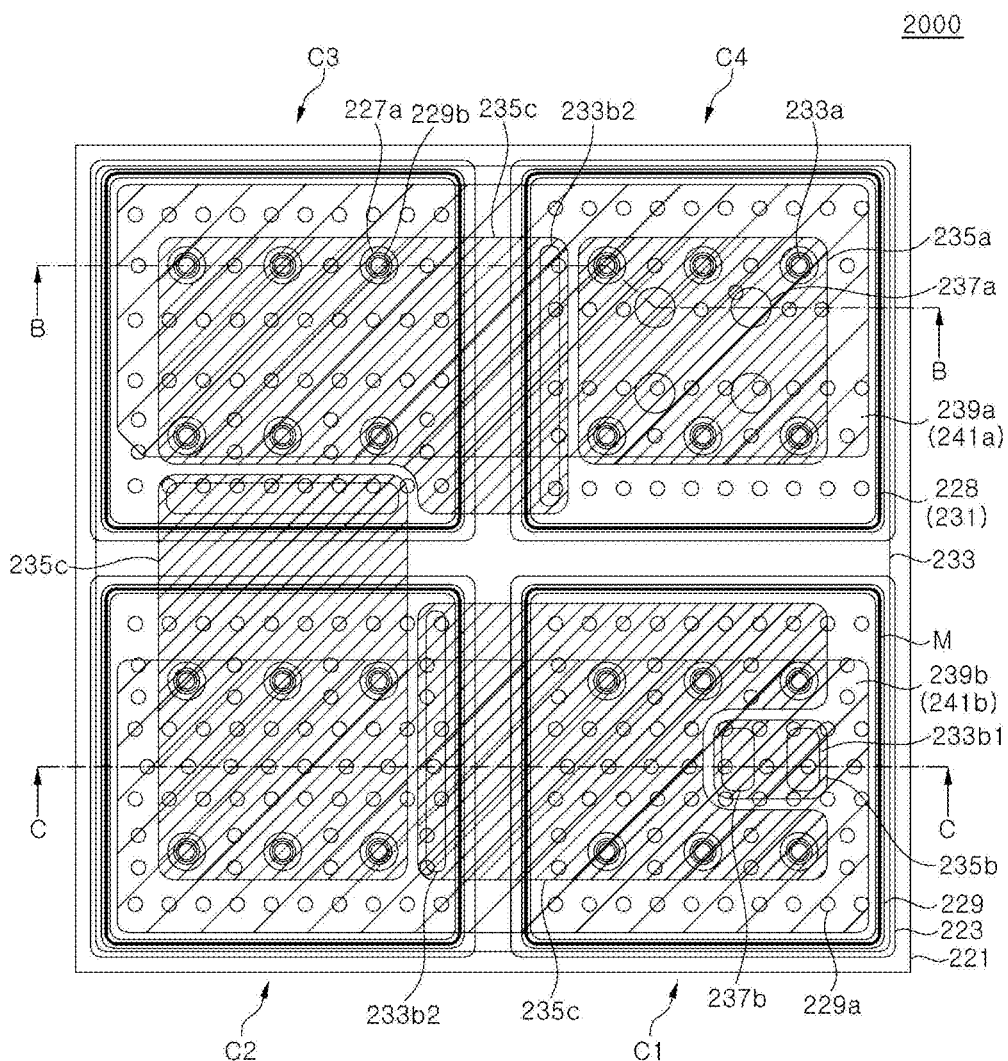
FIG. 20 is a schematic plan view illustrating a light emitting diode according to another exemplary embodiment.
Figure 21:
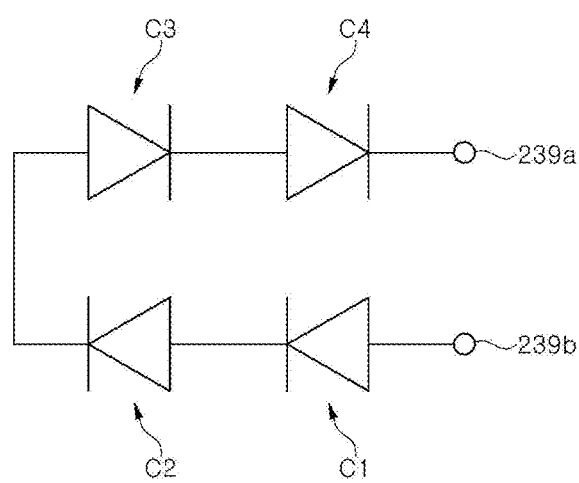
FIG. 21 is a schematic circuit diagram illustrating the light emitting diode of FIG. 20.
Figure 22:
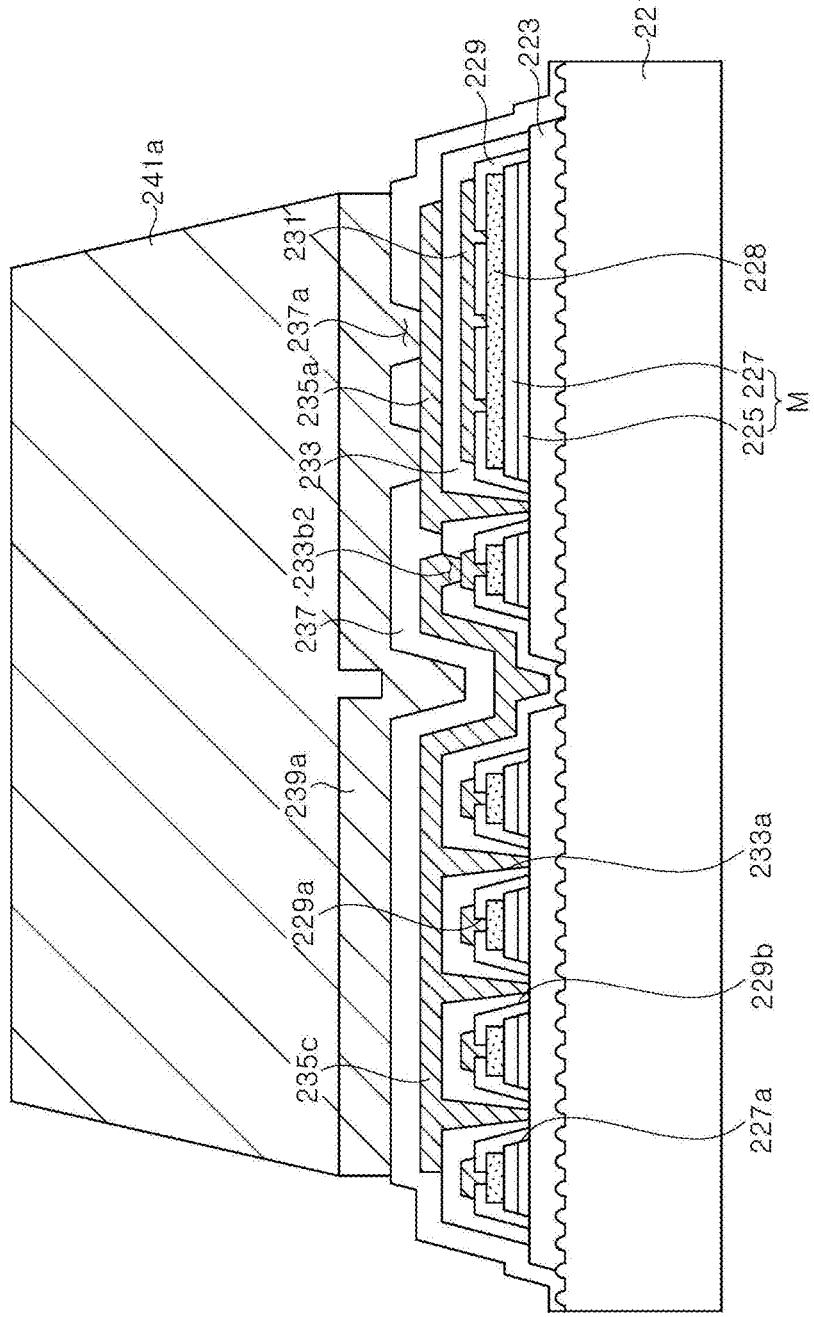
FIG. 22 is a schematic cross-sectional view taken along line B-B of FIG. 20.
Figure 23:
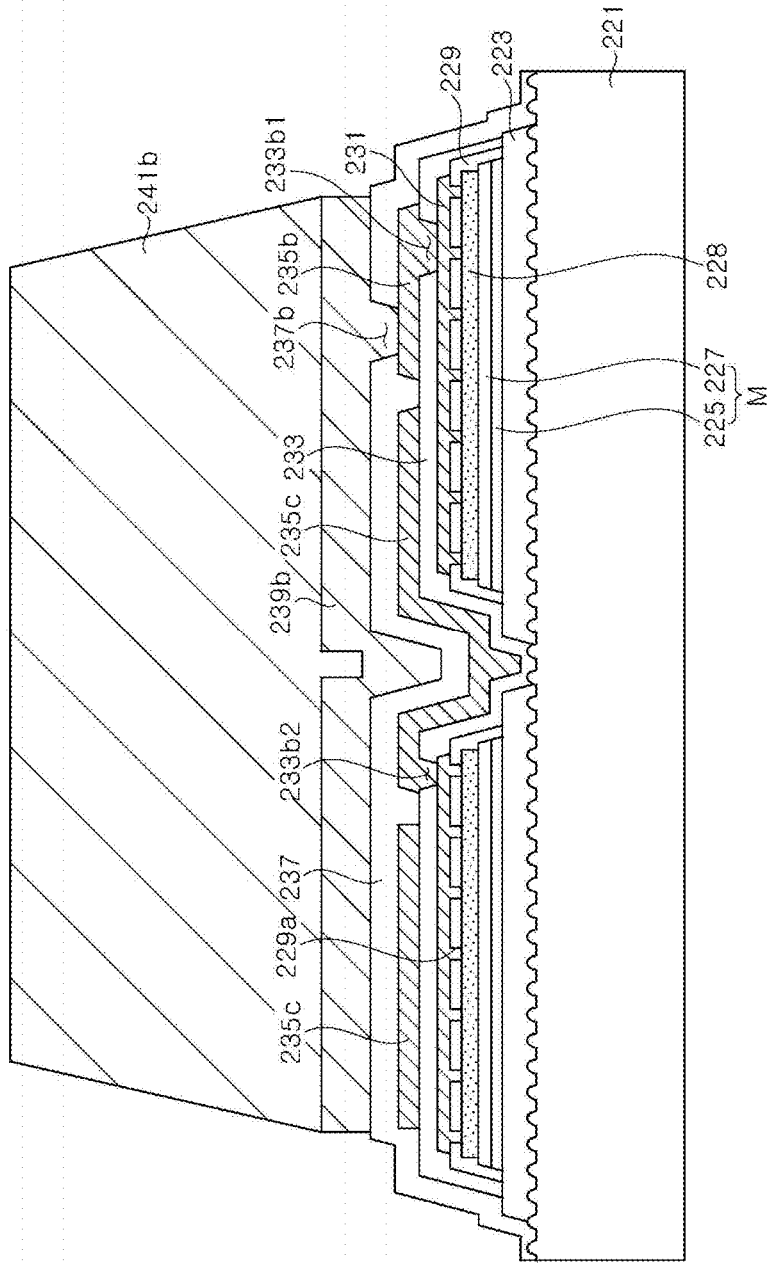
FIG. 23 is a schematic cross-sectional view taken along line C-C of FIG. 20.

FIG. 20 is a schematic plan view illustrating a light emitting diode 2000 according to another exemplary embodiment, FIG. 21 is a schematic circuit diagram illustrating the light emitting diode of FIG. 20, FIG. 22 is a schematic cross-sectional view taken along line B-B of FIG. 20, and FIG. 23 is a schematic cross-sectional view taken along line C-C of FIG. 20.

Referring to FIGS. 20 through 23, the light emitting diode according to the exemplary embodiment is substantially similar to that of the exemplary embodiment described above with reference to FIG. 15 except that a plurality of light emitting cells C1, C2, C3, and C4 is arranged on a substrate 221. The light emitting cells C1, C2, C3, and C4 may be connected in series between a first bump pad 239a and a second bump pad 239b as shown in FIG. 21.

The first through fourth light emitting cells C1, C2, C3, and C4 are disposed on the substrate 221. The first through fourth light emitting cells C1, C2, C3, and C4 are spaced apart from one another by an isolation region exposing the substrate 221. An upper surface of the substrate 221 may be exposed in a region between the light emitting cells.

In the illustrated exemplary embodiment, the first and second light emitting cells C1 and C2 are shown as being disposed below, and the third and fourth light emitting cells C3 and C4 are shown as being disposed above, but the first through fourth light emitting cells C1, C2, C3, and C4 may be arranged in various ways. Further, in the illustrated exemplary embodiment, although four light emitting cells are shown and described as being arranged on the substrate 221, a number of light emitting cells is not particularly limited. For example, two light emitting cells may be disposed on the substrate 221, or seven light emitting cells may be disposed on the substrate 221.

Each of the light emitting cells includes a first conductivity type semiconductor layer 223 and a mesa M. As the first conductivity type semiconductor layer 223 and the mesa M are identical to those described above with reference to FIGS. 15 and 16, detailed descriptions of the same elements will be omitted to avoid redundancy.

The mesa M may be located within a region surrounded by the first conductivity type semiconductor layer 223, and thus, regions near an edge of the first conductivity type semiconductor layer 223 adjacent to outer side surfaces of the first conductivity type semiconductor layer 223 are not covered by the mesa M but exposed to the outside.

In the illustrated exemplary embodiment, each mesa M may include via holes 227a, and the first conductivity type semiconductor layer 223 is exposed in each via hole 227a.

Meanwhile, a conductive oxide layer 228 is disposed on each mesa M, and dielectric layers 229 cover the conductive oxide layer 228 on the light emitting cells C1, C2, C3, and C4 and the mesa, respectively. The conductive oxide layer 228 is in ohmic contact with a second conductivity type semiconductor layer 227. The conductive oxide layer 228 may be disposed over almost an entire region of the mesa M in an upper region of the mesa M. However, the conductive oxide layer 228 may be spaced apart from an edge of the mesa M.

The dielectric layer 229 may cover the upper region and side surfaces of the mesa M, and may cover the first conductivity type semiconductor layer 223 exposed around the mesa M. The dielectric layer 229 also has openings 229a exposing the conductive oxide layer 228. The dielectric layer 229 is located in an upper region of the first conductivity type semiconductor layer 223, and thus, the dielectric layers 229 on different light emitting cells may be spaced apart from one another. However, the inventive concepts are not necessarily limited thereto, and dielectric layers on adjacent light emitting cells may be connected to one another.

A metal reflection layer 231 is disposed on the dielectric layer 229, and connected to the conductive oxide layer 228 through the openings 229a of the dielectric layer 229. The metal reflection layer 231 is disposed in the upper region of the mesa M of each of the light emitting cells C1, C2, C3, and C4.

A lower insulation layer 233 covers the mesas M and covers the metal reflection layer 231 and the dielectric layer 229. The lower insulation layer 233 also covers the first conductivity type semiconductor layer 223 and the substrate 221 exposed to the outside of the dielectric layer 229. When the substrate 221 is a patterned sapphire substrate, the lower insulation layer 233 may be formed along shapes of protrusions on the substrate 221.

As illustrated, an edge of the lower insulation layer 233 may be located on the first conductivity type semiconductor layer 223 of each of the light emitting cells, but the inventive concepts are not limited thereto and may be located on the substrate 221 while covering a side surface of the first conductivity type semiconductor layer 223.

The lower insulation layer 233 has first openings 233a exposing the first conductivity type semiconductor layer 223 in the via holes 227a of each mesa M, and also has a second opening 233b1 exposing the metal reflection layer 231 on the first light emitting cell C1 and second openings 233b2 exposing the metal reflection layers 231 on the second, third, and third light emitting cells C2, C3, and C4.

In the illustrated exemplary embodiment, the lower insulation layer 233 does not include an opening exposing the first conductivity type semiconductor layer 223 around the mesa M. However, the inventive concepts are not limited thereto, and the lower insulation layer 233 may include the opening exposing the first conductivity type semiconductor layer 223 around the mesa M.

The second opening 233b1 is disposed on the first light emitting cell C1, and the second opening 233b2 exposes the metal reflection layer 231 of each of the light emitting cells near the isolation region of the light emitting cells. The second openings 233b2 may generally have an elongated shape along the isolation region, but the inventive concepts are not limited thereto and may have various shapes.

Meanwhile, the second opening 233b1 may be located on the first light emitting cell C1 and may be located in a lower region of the second bump pad 239b. However, in another exemplary embodiment, the second opening 233b1 may be disposed apart from the second bump pad 239b on the first light emitting cell C1 in a lateral direction.

The lower insulation layer 233 may be formed of a single layer or multiple layers, as described with reference to FIGS. 15 and 16, or may include a distributed Bragg reflector. In addition, the lower insulation layer 233 may further include a capping layer covering the distributed Bragg reflector.

Meanwhile, a first pad metal layer 235a, a second pad metal layer 235b, and a connection metal layer 235c are disposed on the lower insulation layer 233.

The first pad metal layer 235a is disposed on the fourth light emitting cell C4, and in ohmic contact with the first conductivity type semiconductor layer 223 exposed in the via holes 227a of the mesa M. In the illustrated exemplary embodiment, although the first pad metal layer 235a is illustrated as contacting the first conductivity type semiconductor layer 223 in the via holes 227a, the first pad metal layer 235a may contact the first conductivity type semiconductor layer 223 around the mesa M. However, by disposing the first pad metal layer 235a in the upper region of the mesa M, the first pad metal layer 235a may be spaced far apart from an edge of the substrate 221, and thus, it is possible to prevent the first pad metal layer 235a from being damaged by moisture permeation from a side surface of the substrate 221.

The second pad metal layer 235b may be disposed on the first light emitting cell C1, and may be electrically connected to the metal reflection layer 231 through the second opening 233b1. Accordingly, the second pad metal layer 235b is electrically connected to the second conductivity type semiconductor layer 227 of the first light emitting cell C1.

The second pad metal layer 235b is located on the mesa M and insulated from the first conductivity type semiconductor layer 223. Furthermore, the second pad metal layer 235b may be spaced apart from the side surfaces of the mesa M on the first light emitting cell C1. As such, it is possible to prevent the second pad metal layer 235b from being damaged by moisture permeation from the side surface of the substrate 221.

Meanwhile, the connection metal layers 235c connect adjacent light emitting cells in series with one another. The connection metal layers 235c may be electrically connected to the first conductivity type semiconductor layer 223 and the second conductivity type semiconductor layer 227 of the adjacent light emitting cells through the first opening 233a and the second opening 233b2 of the lower insulation layer 233. For example, one connection metal layer 235c may be electrically connected to the first conductivity type semiconductor layer 223 in the first light emitting cell C1, and may also be electrically connected to the metal reflection layer 231 on the second light emitting cell C2. Accordingly, the first light emitting cell C1 and the second light emitting cell C2 are connected in series with each other through the connection metal layer 233c. As such, the second light emitting cell C2 and the third light emitting cell C3 may be connected in series through the connection metal layer 235c, and the third light emitting cell C3 and the fourth light emitting cell C4 may be connected in series through the connection metal layer 235c.

The connection metal layers 235c are spaced apart from the first pad metal layer 235a and the second pad metal layer 235b. Further, the connection metal layers 235c may be formed to have a narrower width than that of the mesa M, and thus, may be spaced apart from the edge of the substrate 221 farther than the mesa M.

The first pad metal layer 235a and the second pad metal layer 235b may be formed together using the same material through the same process. For example, the first and second pad metal layers 235a and 235b and the connection metal layers 235c may include an ohmic reflection layer such as an Al layer, and the ohmic reflection layer may be formed on an adhesive layer such as Ti, Cr, Ni, or the like. In addition, a protection layer having a single layer or a composite layer structure of Ni, Cr, Au, or the like may be formed on the ohmic reflection layer. The first and second pad metal layers 235a and 235b and the connection metal layers 235c may have, for example, a multi-layered structure of Cr/Al/Ni/Ti/Ni/Ti/Au/Ti.

An upper insulation layer 237 is disposed on the first pad metal layer 235a, the second pad metal layer 235b, and the connection metal layers 235c, and has a first opening 237a exposing the first pad metal layer 235a and a second opening 237b exposing the second pad metal layer 235b. The upper insulation layer 237 may cover an upper surface of the substrate 221 exposed around the light emitting cells. The upper insulation layer 237 may cover the edge of the substrate 221 as illustrated, but the inventive concepts are not limited thereto, and an edge of the upper insulation layer 237 may be located inside the edge of the substrate 221.

Meanwhile, the first opening 237a may be disposed in an upper region of the first pad metal layer 235a, and thus, may be spaced apart from the connection metal layer 235c and the second opening 233b2 of the lower insulation layer 233. In addition, the second opening 237b is also limitedly located on the second pad metal layer 235b, and spaced apart from the connection metal layer 235c.

In the illustrated exemplary embodiment, the first and second pad metal layers 235a and 235b exposed through the first and second openings 237a and 237b of the upper insulation layer 237 may be used as a bump pad on which solder bumps 241a and 241b are formed. Alternatively, as described with reference to FIGS. 15 and 16, the first and second bump pads 239a and 239b may cover the first and second pad metal layers 235a and 235b exposed through the first and second openings 237a and 237b of the upper insulation layer 237, respectively. The first and second bump pads 239a and 239b may be disposed over the plurality of light emitting cells, respectively, and may cover the first and second openings 237a and 37b and seal them.

The first solder bump 241a and the second solder bump 241b are disposed on the first bump pad 239a and the second bump pad 239b, respectively. The first and second solder bumps 241a and 241b may have a bottom surface having a same shape as those of the first bump pad 239a and the second bump pad 239b. Meanwhile, since thicknesses of the first solder bumps 241a and the second solder bumps 241b, an interval therebetween, and an interval between the first solder bumps 241a and the second solder bumps 241b and the edge of the substrate 221 are identical to those described with reference to FIGS. 17 and 18, detailed descriptions thereof will be omitted to avoid redundancy.

Figure 24:
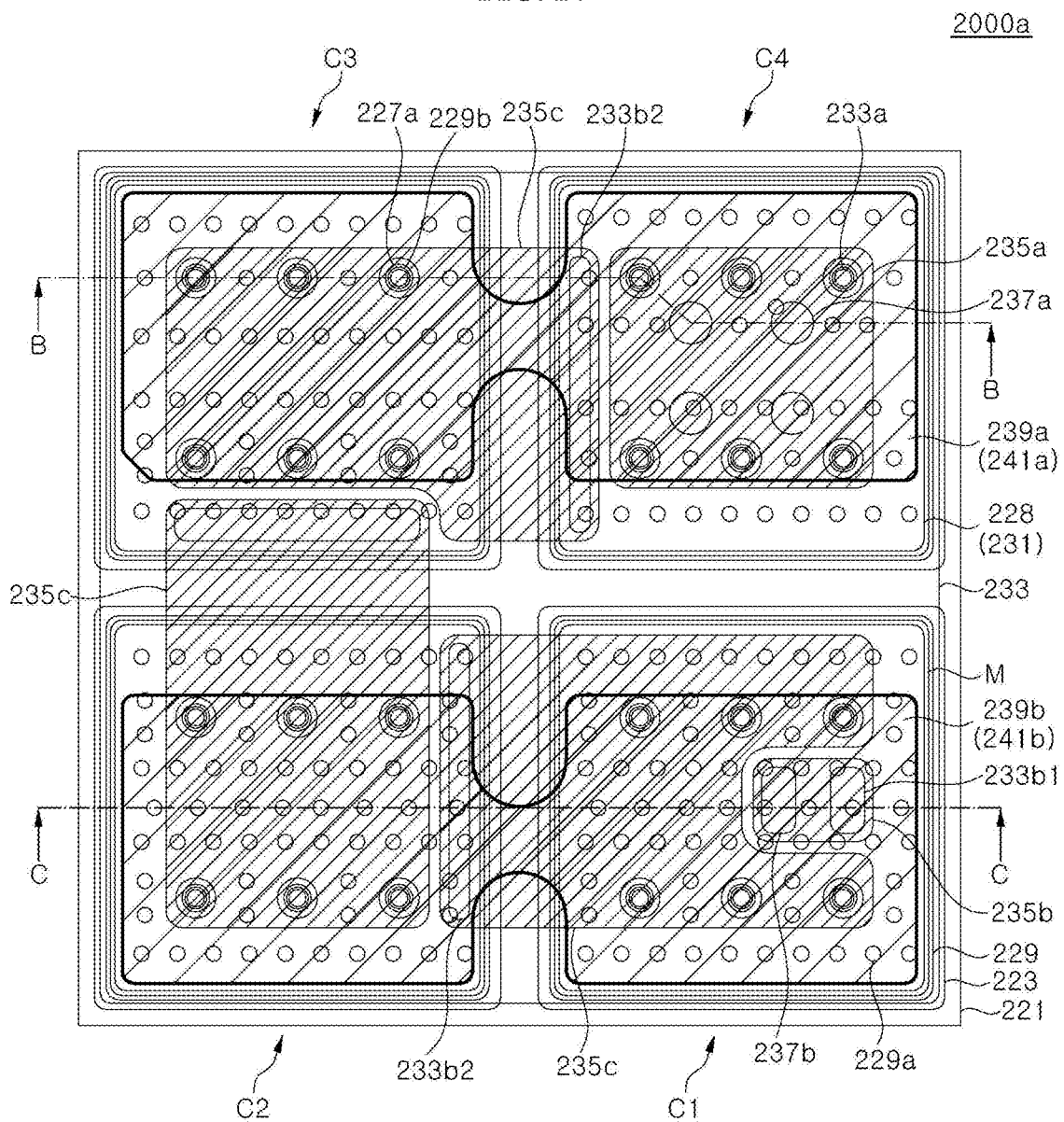
FIG. 24 is a schematic cross-sectional view illustrating a light emitting diode according to another exemplary embodiment.
Figure 25:
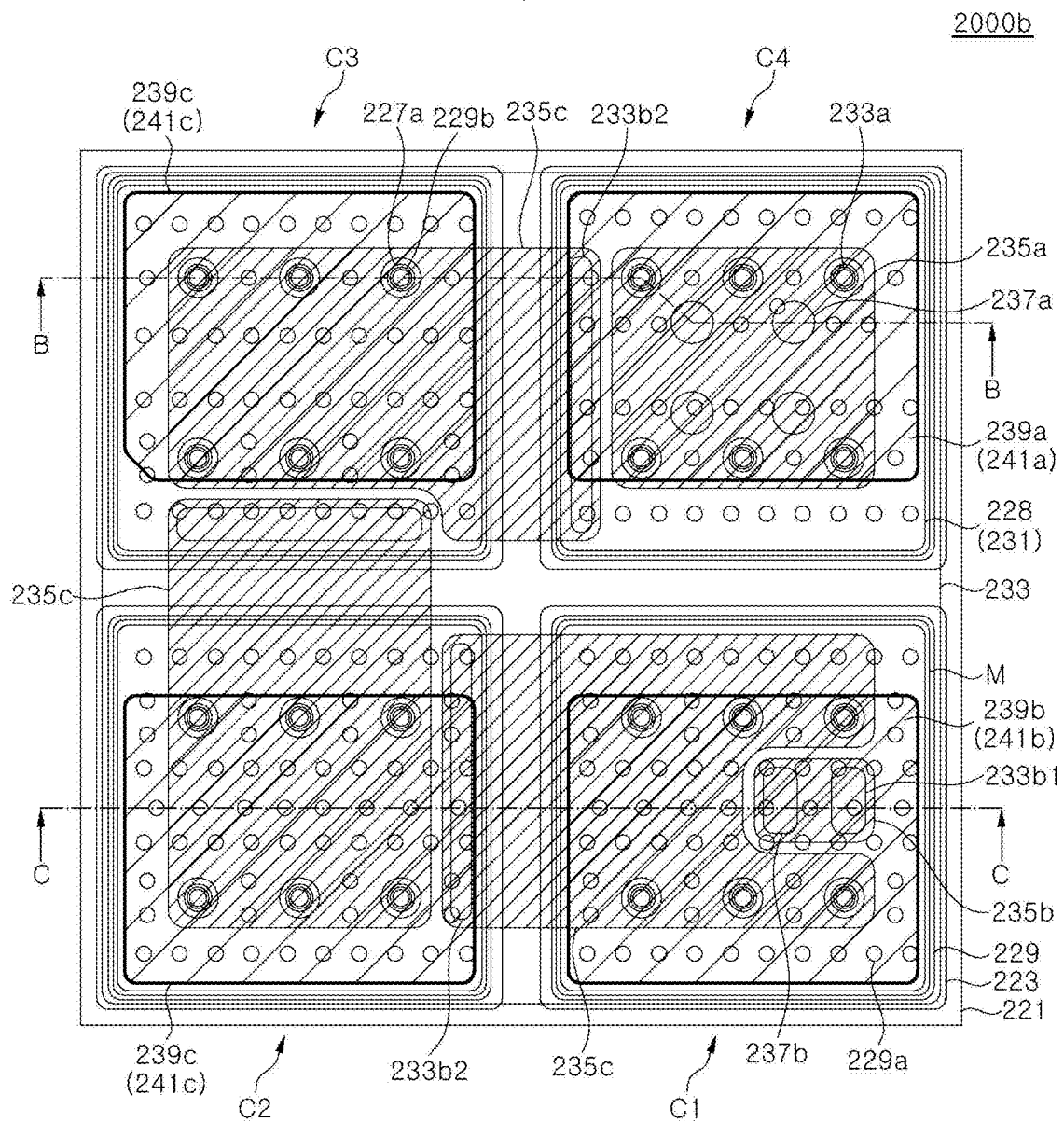
FIG. 25 is a schematic plan view illustrating a light emitting diode according to another exemplary embodiment.

FIGS. 24 and 25 are schematic plan views illustrating light emitting diodes 200a and 200b according to other exemplary embodiments.

Referring to FIG. 24, the light emitting diode 200a according to the illustrated exemplary embodiment is substantially similar to the light emitting diode described with reference to FIGS. 20 through 23, but there is a difference in shapes of first and second bump pads 239a and 239b, and thus, there is a difference in shapes of first and second solder bumps 241a and 241b.

That is, in the light emitting diode 2000, the first and second bump pads 239a and 239b generally have the elongated rectangular shape, and are disposed over the plurality of light emitting cells, respectively. In contrast, in the light emitting diode 200a, the first and second bump pads 239a and 239b are disposed over the plurality of light emitting cells, respectively, but they include a region having a narrow width between the light emitting cells.

The first and second solder bumps 241a and 241b may cover the first and second bump pads 239a and 239a, and may be formed to have the same shape as those of the first and second bump pads 239a and 239b.

Referring to FIG. 25, the light emitting diode 200b according to the exemplary embodiment is substantially similar to the light emitting diode 2000 described with reference to FIGS. 20 through 23 except that the first and second bump pads 239a and 239b are disposed on single light emitting cells C4 and C1, respectively, and dummy bump pads 239c are disposed on the other light emitting cells C2 and C3, respectively.

The dummy bump pads 239c are formed together on an upper insulation layer 237 in a same process as that of the first and second bump pads 239a and 239b. However, the dummy bump pads 239c are electrically spaced apart from the first through fourth light emitting cells C1, C2, C3 and C4 by the upper insulation layer 237.

Meanwhile, the first and second solder bumps 241a and 241b may be disposed on the first and second bump pads 239a and 239b, respectively, and a dummy solder bump 241c may be disposed on the dummy bump pad 239c. The dummy solder bumps 241c may be omitted, and thus, an amount of solder paste for forming the solder bumps may be reduced.

In the illustrated exemplary embodiment, the light emitting diode including four light emitting cells has been exemplarily described, but the light emitting diode may include more than four light emitting cells. In this case, the solder bumps may be arranged to stabilize a mounting process of the light emitting diode. For example, a first solder bump may be disposed over at least two light emitting cells disposed near one edge of a substrate, and a second solder bump may be disposed over at least two light emitting cells disposed near the opposite edge of the substrate. Alternatively, a dummy solder bump may be disposed on at least one of at least two light emitting cells disposed near one edge of the substrate, and a first solder bump may be disposed on at least one of the other light emitting cells. In addition, the dummy solder bump may be disposed on at least one of the at least two light emitting cells disposed near the opposite edge of the substrate, and a second solder bump may be disposed on at least one of the other light emitting cells.

Figure 26:
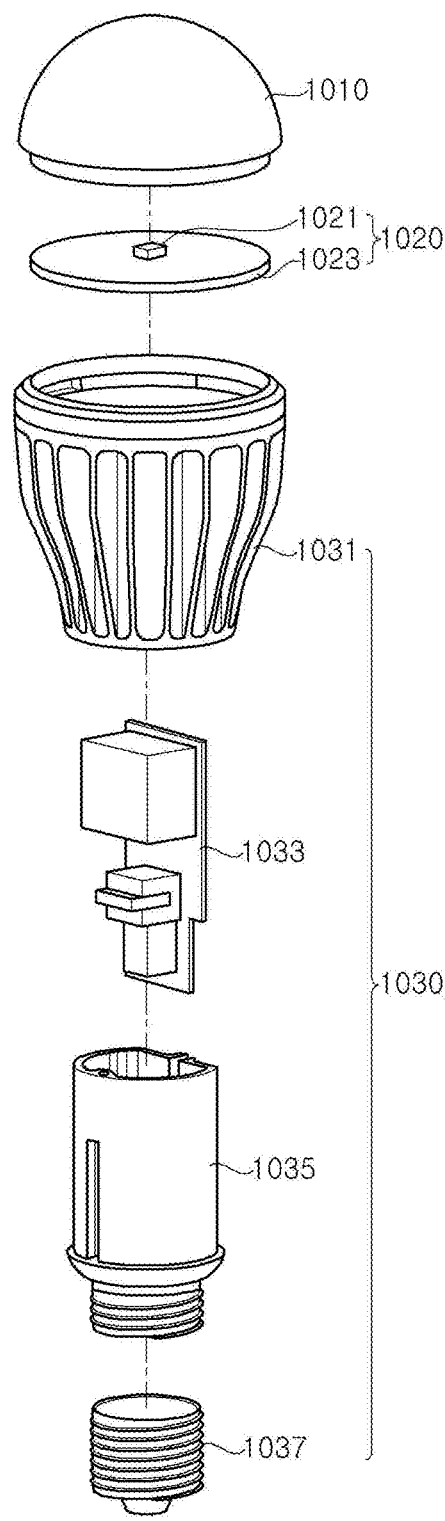
FIG. 26 is an exploded perspective view illustrating a lighting apparatus to which a light emitting diode according to an exemplary embodiment is applied.

FIG. 26 is an exploded perspective view illustrating a lighting apparatus to which a light emitting diode according to an exemplary embodiment is applied.

Referring to FIG. 26, the lighting apparatus according to the illustrated exemplary embodiment includes a diffusion cover 1010, a light emitting device module 1020, and a body 1030. The body 1030 may accommodate the light emitting device module 1020, and the diffusion cover 1010 may be disposed on the body 1030 to cover an upper portion of the light emitting device module 1020.

The body 1030 is not limited in a specific shape as long as it accommodates and supports the light emitting device module 1020, and is capable of supplying electrical power to the light emitting device module 1020. For example, as illustrated in the drawing, the body 1030 may include a body case 1031, a power supply device 1033, a power supply case 1035, and a power source connection 1037.

The power supply device 1033 may be accommodated in the power supply case 1035 to be electrically connected to the light emitting device module 1020, and may include at least one IC chip. The IC chip may regulate, change, or control a characteristic of power supplied to the light emitting device module 1020. The power supply case 1035 may receive and support the power supply 1033, and the power supply case 1035 to which the power supply 1033 is secured therein may be located inside the body case 1031. The power source connection 1037 may be disposed at a lower end of the power supply case 1035 to be bound to the power supply case 1035. Accordingly, the power source connection 1037 may be electrically connected to the power supply 1033 inside the power supply case 1035, and may serve as a passage through which external power may be supplied to the power supply 1033.

The light emitting device module 1020 includes a substrate 1023 and a light emitting device 1021 disposed on the substrate 1023. The light emitting device module 1020 may be provided on the body case 1031 and electrically connected to the power supply 1033.

The substrate 1023 is not limited as long as it is a substrate capable of supporting the light emitting device 1021, and may be, for example, a printed circuit board including an interconnection formed thereon. The substrate 1023 may have a shape corresponding to a securing portion formed at the upper portion of the body case 1031 so as to be stably secured to the body case 1031. The light emitting device 1021 may include at least one of the light emitting diodes according to the above-described exemplary embodiments of the present disclosure.

The diffusion cover 1010 may be disposed on the light emitting device 1021, and may be secured to the body case 1031 to cover the light emitting device 1021. The diffusion cover 1010 may be formed of a light transmitting material and light orientation of the lighting apparatus may be adjusted through regulation of the shape and optical transmissivity of the diffusion cover 1010. Therefore, the diffusion cover 1010 may be modified to have various shapes depending on usage and applications of the lighting apparatus.

Figure 27:
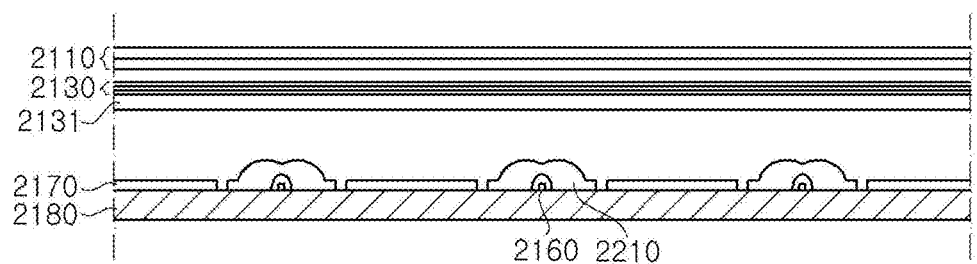
FIG. 27 is a cross-sectional view illustrating a display apparatus to which a light emitting diode according to another exemplary embodiment is applied.

FIG. 27 is a cross-sectional view illustrating a display apparatus to which a light emitting diode according to another exemplary embodiment is applied.

The display apparatus of the exemplary embodiment includes a display panel 2110, a backlight unit supplying light to the display panel 2110, and a panel guide supporting a lower edge of the display panel 2110.

The display panel 2110 is not particularly limited, and may be, for example, a liquid crystal display panel including a liquid crystal layer. Gate driving PCBs for supplying a driving signal to a gate line may be further located at an edge of the display panel 2110. Here, the gate driving PCBs may be formed on a thin film transistor substrate instead of being formed on separate PCBs.

The backlight unit includes a light source module including at least one substrate and a plurality of light emitting devices 2160. Furthermore, the backlight unit may further include a bottom cover 2180, a reflection sheet 2170, a diffusion plate 2131, and optical sheets 2130.

The bottom cover 2180 may be opened upward, and may accommodate the substrate 1023, the light emitting device 2160, the reflection sheet 2170, the diffusion plate 2131, and the optical sheets 2130. In addition, the bottom cover 2180 may be coupled to the panel guide. The substrate may be disposed under the reflection sheet 2170, and may be disposed in a form surrounded by the reflection sheet 2170. However, the inventive concepts are not limited thereto, and when a reflective material is coated on a surface of the substrate, the substrate may be located on the reflection sheet 2170. Moreover, a plurality of substrates may be formed so that the plurality of substrates is arranged in a form flush with one another, but the inventive concepts are not limited thereto, and may be formed as a single substrate.

The light emitting device 2160 may include the light emitting diode according to the above-described exemplary embodiments of the present disclosure. The light emitting devices 2160 may be regularly arranged in a constant pattern on the substrate. In addition, a lens 2210 may be disposed on each light emitting device 2160 to improve uniformity of light emitted from the plurality of light emitting devices 2160.

The diffusion plate 2131 and the optical sheets 2130 are located on the light emitting device 2160. Light emitted from the light emitting device 2160 may be supplied to the display panel 2110 in a form of a surface light source through the diffusion plate 2131 and the optical sheets 2130.

As described above, the light emitting device according to the exemplary embodiments of the present disclosure may be applied to a direct type display apparatus as that of this exemplary embodiment.

Figure 28:
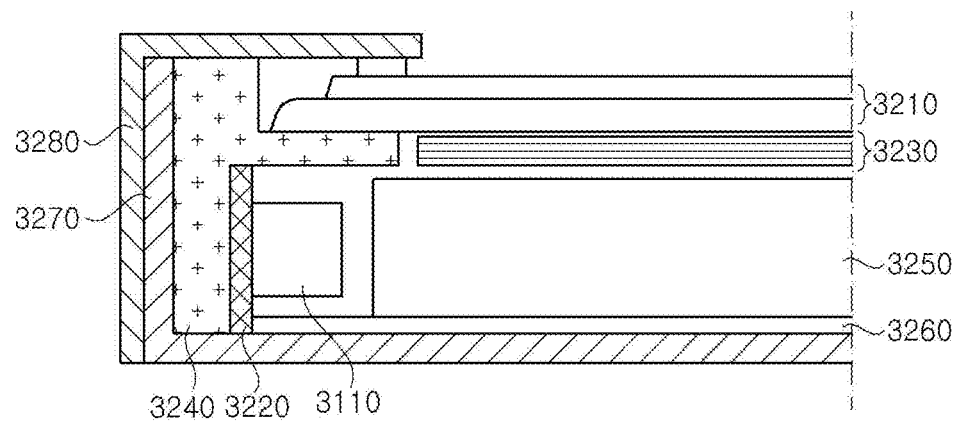
FIG. 28 is a cross-sectional view illustrating a display apparatus to which a light emitting diode according to another exemplary embodiment is applied.

FIG. 28 is a cross-sectional view illustrating a display apparatus to which a light emitting diode according to another exemplary embodiment is applied.

The display apparatus provided with a backlight unit according to the illustrated exemplary embodiment includes a display panel 3210 on which an image is displayed, and a backlight unit disposed on a rear surface of the display panel 3210 to irradiate light. Furthermore, the display apparatus includes a frame 240 supporting the display panel 3210 and accommodating the backlight unit, and covers 3240 and 3280 covering the display panel 3210.

The display panel 3210 is not particularly limited, and may be, for example, a liquid crystal display panel including a liquid crystal layer. Gate driving PCBs for supplying a driving signal to a gate line may be further located at an edge of the display panel 3210. Here, the gate driving PCBs may be formed on a thin film transistor substrate instead of being formed on separate PCBs. The display panel 3210 may be secured by the covers 3240 and 3280 located at upper and lower portions thereof, and the cover 3280 located thereunder may be coupled to the backlight unit.

The backlight unit supplying light to the display panel 3210 includes a lower cover 3270 having a partially opened upper surface, a light source module disposed at an inner side of the lower cover 3270, and a light guide plate 3250 located in flush with the light source module and converting spotlight into surface light. In addition, the backlight unit of the illustrated exemplary embodiment may further include optical sheets 3230 located on the light guide plate 3250 to diffuse and collect light, and a reflection sheet 3260 disposed at a lower side of the light guide plate 3250 to reflect light proceeding in a downward direction of the light guide plate 3250 toward the display panel 3210.

The light source module includes a substrate 3220 and a plurality of light emitting devices 3110 disposed apart from one another at regular intervals on one surface of the substrate 3220. The substrate 3220 is not limited as long as it supports the light emitting device 3110 and electrically connected to the light emitting device 3110, and may be, for example, a printed circuit board. The light emitting device 3110 may include at least one light emitting diode according to the above-described exemplary embodiments of the present disclosure. Light emitted from the light source module is incident on the light guide plate 3250 and supplied to the display panel 3210 through the optical sheets 3230. Through the light guide plate 3250 and the optical sheets 3230, a spotlight source emitted from the light emitting devices 3110 may be converted into a surface light source.

As described above, the light emitting device according to the exemplary embodiments of the present disclosure may be applied to an edge type display apparatus as that of this exemplary embodiment.

Figure 29:
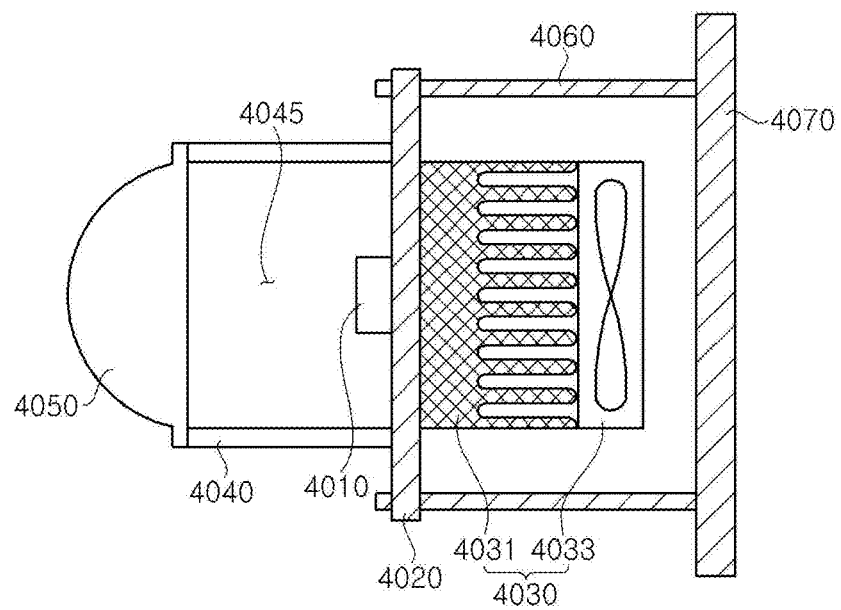
FIG. 29 is a cross-sectional view illustrating an example in which a light emitting diode according to another exemplary embodiment is applied to a head lamp.

FIG. 29 is a cross-sectional view illustrating an example in which a light emitting diode according to another exemplary embodiment is applied to a head lamp.

Referring to FIG. 29, the head lamp includes a lamp body 4070, a substrate 4020, a light emitting device 4010, and a cover lens 4050. Moreover, the head lamp may further include a heat dissipation unit 4030, a support rack 4060, and a connection member 4040.

The substrate 4020 is secured by the support rack 4060 and disposed apart on the lamp body 4070. The substrate 4020 is not limited as long as it is a substrate capable of supporting the light emitting device 4010, and may be, for example, a substrate having a conductive pattern such as a printed circuit board. The light emitting device 4010 may be located on the substrate 4020, and may be supported and secured by the substrate 4020. In addition, the light emitting device 4010 may be electrically connected to an external power source through the conductive pattern of the substrate 4020. Moreover, the light emitting device 4010 may include at least one light emitting diode according to the above-described exemplary embodiments of the present disclosure.

The cover lens 4050 is located on a path through which light emitted from the light emitting device 4010 proceeds. For example, as shown in the drawing, the cover lens 4050 may be disposed apart from the light emitting device 4010 by the connection member 4040, and may be disposed in a direction in which light emitted from the light emitting device 4010 is to be provided. A viewing angle and/or color of light emitted from the head lamp to the outside may be adjusted by the cover lens 4050. Meanwhile, the connecting member 4040 may be disposed to surround the light emitting device 4010 and serve as a light guide for providing the light emitting path 4045, while securing the cover lens 4050 to the substrate 4020. In this case, the connection member 4040 may be formed of a light reflective material or coated with the light reflective material. Meanwhile, the heat dissipation unit 4030 may include a heat dissipation fin 4031 and/or a heat dissipation fan 4033 and radiates heat generated when the light emitting device 4010 is driven to the outside.

As described above, the light emitting device according to the exemplary embodiments of the present disclosure may be applied to a head lamp as that of this exemplary embodiment, particularly, a vehicle head lamp.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

What is claimed is:

1. A light emitting module, comprising:
a printed circuit board;
a light emitting device disposed on the printed circuit board and including a light source; and
a diffuser disposed on the light emitting device,
wherein the light source includes:
a first conductivity type semiconductor layer;
a mesa disposed on the first conductivity type semiconductor layer and including an active layer and a second conductivity type semiconductor layer; and
a transparent conductive oxide layer disposed on the mesa and electrically connected to the second conductivity type semiconductor layer;
a metal reflection layer disposed on the mesa and electrically connected to the second conductivity type semiconductor layer; and
a dielectric layer disposed between the second conductivity type semiconductor layer and the metal reflection layer, and
wherein the active layer generates light having a peak wavelength of about 500 nm or less;
wherein the second conductivity type semiconductor layer includes an impurity having a concentration profile including a region that a concentration of the impurity varies along a thickness direction,
wherein the metal reflection layer includes a region spaced apart from a surface of the second conductivity type semiconductor layer by the dielectric layer including a region having a thickness in a range between 200 nm and 1000 nm.

2. The light emitting module of claim 1, wherein the dielectric layer includes an opening that forms an electrical connection passage.

3. The light emitting module of claim 2, wherein the metal reflection layer includes a region being in contact with a surface of the dielectric layer.

4. The light emitting module of claim 3, wherein the metal reflection layer includes a barrier layer including Ni or Au.

5. The light emitting module of claim 1, wherein the mesa includes an indentation extended from one edge of the mesa toward another edge opposite to the one edge.

6. The light emitting module of claim 5, wherein a length of the indentation is longer than a length of the mesa.

7. The light emitting module of claim 6, wherein an end portion of the indentation has a round shape.

8. A light emitting module, comprising:
a printed circuit board;
a light emitting device disposed on the printed circuit board and including a light source; and
a diffuser disposed on the light emitting device,
wherein the light source includes:
a first conductivity type semiconductor layer;
a mesa disposed on the first conductivity type semiconductor layer and including an active layer and a second conductivity type semiconductor layer;
a transparent conductive oxide layer disposed on the mesa and electrically connected to the second conductivity type semiconductor layer,
a metal reflection layer disposed on the mesa and electrically connected to the second conductivity type semiconductor layer; and a dielectric layer disposed between the second conductivity type semiconductor layer and the metal reflection layer and including a region having a thickness in a range between 200 nm and 1000 nm, wherein the active layer is configured to generate light including a peak wavelength of about 500 nm or less, wherein the second conductivity type semiconductor layer includes an impurity having a concentration profile including a region that a concentration of the impurity varies along thickness direction, wherein the metal reflection layer includes a first region being in contact with a surface of the second conductivity type semiconductor layer and a second region being in contact with the dielectric layer.

9. The light emitting module of claim 8, wherein the dielectric layer includes an opening that forms an electrical connection passage.

10. The light emitting module of claim 9, wherein the metal reflection layer includes a region in contact with a surface of the dielectric layer.

11. The light emitting module of claim 10, wherein the metal reflection layer includes a barrier layer including Ni or Au.

12. The light emitting module of claim 8, wherein the mesa includes an indentation extended from one edge of the mesa toward another edge opposite to the one edge.

13. The light emitting module of claim 12, wherein a length of the indentation is longer than a length of the mesa.

14. The light emitting module of claim 13, wherein an end portion of the indentation has round shape.

15. A light emitting module, comprising:
a printed circuit board;
a light emitting device disposed on the printed circuit board and including a light source; and
a diffuser disposed on the light emitting device,
wherein the light source includes:
a first conductivity type semiconductor layer;
a mesa disposed on the first conductivity type semiconductor layer and including an active layer and a second conductivity type semiconductor layer;
a transparent conductive oxide layer disposed on the mesa and electrically connected to the second conductivity type semiconductor layer,
a metal reflection layer disposed on the mesa and electrically connected to the second conductivity type semiconductor layer; and
a dielectric layer disposed between the second conductivity type semiconductor layer and the metal reflection layer,
wherein the active layer is configured to generate light including a peak wavelength of about 500 nm or less,
wherein the second conductivity type semiconductor layer includes an impurity having a concentration profile including a region that a concentration of the impurity varies along a thickness direction,
wherein a region of the metal reflection layer and a region of the dielectric layer, and the second conductivity type semiconductor layer are sequentially disposed along the thickness direction, the region of the dielectric layer including a region having a thickness in a range 200~1000 nm.

16. The light emitting module of claim 15, wherein the dielectric layer includes an opening that forms an electrical connection passage.

17. The light emitting module of claim 16, wherein the metal reflection layer includes a region being in contact with a surface of the dielectric layer.

18. The light emitting module of claim 17, wherein the metal reflection layer includes a barrier layer including Ni or Au.

19. The light emitting module of claim 15, wherein the mesa includes an indentation extended from one edge of the mesa toward another edge opposite to the one edge.

20. The light emitting module of claim 19, wherein a length of the indentation is longer than a length of the mesa, and wherein an end portion of the indentation has a round shape.

* * * * *